(12) United States Patent
Miyamura et al.

(10) Patent No.: US 11,139,024 B2
(45) Date of Patent: Oct. 5, 2021

(54) SEMICONDUCTOR DEVICE

(71) Applicant: NanoBridge Semiconductor, Inc., Ibaraki (JP)

(72) Inventors: Makoto Miyamura, Tokyo (JP); Yukihide Tsuji, Tokyo (JP); Toshitsugu Sakamoto, Tokyo (JP); Ryusuke Nebashi, Tokyo (JP); Ayuka Tada, Tokyo (JP); Xu Bai, Tokyo (JP)

(73) Assignee: NANOBRIDGE SEMICONDUCTOR, INC., Ibaraki (JP)

( * ) Notice: Subject to any disclaimer, the term of this patent is extended or adjusted under 35 U.S.C. 154(b) by 11 days.

(21) Appl. No.: 16/489,912

(22) PCT Filed: Feb. 28, 2018

(86) PCT No.: PCT/JP2018/007421
§ 371 (c)(1),
(2) Date: Aug. 29, 2019

(87) PCT Pub. No.: WO2018/159653
PCT Pub. Date: Sep. 7, 2018

(65) Prior Publication Data
US 2020/0234760 A1    Jul. 23, 2020

(30) Foreign Application Priority Data

Mar. 1, 2017    (JP) .............................. JP2017-038365

(51) Int. Cl.
*G11C 13/00*    (2006.01)
(52) U.S. Cl.
CPC ........ *G11C 13/003* (2013.01); *G11C 13/0011* (2013.01); *G11C 13/0069* (2013.01); *G11C 2213/79* (2013.01)
(58) Field of Classification Search
CPC .............................. G11C 13/003; G11C 13/00
(Continued)

(56) References Cited

U.S. PATENT DOCUMENTS 9,508,432 B2    11/2016  Miyamura et al.
2010/0265757 A1*  10/2010  Otsuka ................ H01L 45/1266
                                                365/148
(Continued)

FOREIGN PATENT DOCUMENTS

JP    2005-101535 A    4/2005
JP    2010-251491 A    11/2010
(Continued)

OTHER PUBLICATIONS

Shunichi Kaeriyama et al., "A Nonvolatile Programmable Solid-Electrolyte Nanometer Switch", IEEE Journal of Solid-State Circuits, Jan. 2005, pp. 168-176, vol. 40, No. 1.
(Continued)

*Primary Examiner* — Muna A Techane
(74) *Attorney, Agent, or Firm* — Dority & Manning, P.A.

(57) ABSTRACT

In order to eliminate an increase in the source potential of a transistor selected during writing or reading, this semiconductor device is equipped with: a variable-resistance type first switch having a first terminal and a second terminal; a variable-resistance type second switch having a third terminal and a fourth terminal, the third terminal being connected to the second terminal to form an intermediate node; first wiring connected to the first terminal; second wiring connected to the fourth terminal and, in a planar view, extending in a direction crossing the first wiring; a first selection transistor connected to the first wiring; a second selection transistor connected to the second wiring; a first well terminal connection line to which a well terminal of the first selection transistor is connected; and a second well terminal connection line to which a well terminal of the second selection transistor is connected.

13 Claims, 14 Drawing Sheets

(58) Field of Classification Search
USPC ......................................................... 365/148
See application file for complete search history.

(56) References Cited

U.S. PATENT DOCUMENTS

| | | | | |
|---|---|---|---|---|
| 2012/0075910 A1* | 3/2012 | Yasuda | .............. | G11C 13/0069 |
| | | | | 365/148 |
| 2014/0244930 A1* | 8/2014 | Lee | ......................... | G06F 3/061 |
| | | | | 711/118 |
| 2015/0036421 A1* | 2/2015 | Kim | ......................... | G11C 7/14 |
| | | | | 365/158 |
| 2015/0131358 A1* | 5/2015 | Miyamura | ......... | H03K 19/0013 |
| | | | | 365/72 |

FOREIGN PATENT DOCUMENTS

| WO | 2010/070895 A1 | 6/2010 |
|---|---|---|
| WO | 2013/190741 A1 | 12/2013 |

OTHER PUBLICATIONS

International Search Report of PCT/JP2018/007421 dated Apr. 3, 2018 [PCT/ISA/210].
Written Opinion of PCT/JP2018/007421 dated Apr. 3, 2018 [PCT/ISA/237].

* cited by examiner dimension of a transistor to be large, there occurs an issue that area efficiency is deteriorated.

SEMICONDUCTOR DEVICE

CROSS REFERENCE TO RELATED APPLICATIONS

This application is a National Stage of International Application No. PCT/JP2018/007421, filed Feb. 28, 2018, claiming priority to Japanese Patent Application No. 2017-038365, filed Mar. 1, 2017, the contents of all of which are incorporated herein by reference in their entirety.

TECHNICAL FIELD

The present invention relates to a semiconductor device. More particularly, the present invention relates to a storage circuit including a variable-resistance type non-volatile element (hereinafter, also referred to as a "resistance variable element") inside a multi-layered wiring layer, a lookup table circuit, and a re-configurable logic circuit using the same.

BACKGROUND ART

Accompanied by microfabrication of a semiconductor integrated circuit, a Metal Oxide Semiconductor Field Effect Transistor (MOSFET) is highly integrated, namely, integrated four times in three years.

In such a situation, an opportunity of using a semiconductor device in which a designer can electrically program a desired circuit with respect to a semiconductor chip after production, is increasing. As a specific example of a programmable semiconductor device, a Field Programmable Gate Array (FPGA) and the like are exemplified.

However, it is known that an FPGA needs transistors of ten times or more as compared with a custom-designed semiconductor device, in order to implement a same function. Therefore, a current FPGA has an issue that area efficiency is poor, and consequently, electric power consumption also increases. In recent years, a programmable wiring is implemented by mounting a resistance variable element inside a multi-layered wiring layer. A research that an overhead of an FPGA is reduced, and power saving/low electric power is achieved by employing this technique is carried out.

As specific examples of a resistance variable element, a Resistance Random Access Memory (ReRAM) employing transition metal oxide, a Nano Bridge (Registered Trademark) employing an ion conductor, and the like are exemplified. Patent Literature 1 (PTL1) and Non-Patent Literature 1 (NPL1) disclose resistance variable elements employing movement of metal ions and electrochemical reaction within solid (hereinafter, also referred to as an "ion conductor") in which ions can freely move responding to applying an electric field or the like.

The resistance variable elements disclosed in PTL1 and NPL1 are constituted of an ion conductive layer, and a first electrode and a second electrode formed on a surface facing the ion conductive layer and in contact with the ion conductive layer. Metal ions are supplied from the first electrode to the ion conductive layer. Metal ions are not supplied from the second electrode. The resistance variable elements disclosed in PTL1 and NPL1 change a resistance value of an ion conductor responding to a change in polarity of an applied voltage. Further, the resistance variable elements control a conductive state between the two electrodes.

Further, PTL1 and Patent Literature 3 (PTL3), and NPL1 disclose a crossbar switch in which a resistance variable element is used for an Ultra-Large Scale Integration (ULSI).

Further, Patent Literature 2 (PTL2) discloses a case that two resistance variable elements are connected as a unit element. Patent Literature 4 (PTL4) relates to a writing method for a non-volatile storage device including a memory cell in which a resistance value reversely changes, and proposes that a bias voltage is applied to a substrate on which a writing driving circuit is formed, when an electrical signal for writing is given to the memory cell.

CITATION LIST

Patent Literature

[PTL1] Japanese Patent Application Laid-Open No. 2005-101535
[PTL2] United States Patent No. 9508432
[PTL3] International Publication No. WO2013/190741
[PTL4] International Publication No. WO2010/070895

Non Patent Literature

[NPL1] Shunichi Kaeriyama et al., "A Nonvolatile Programmable Solid-Electrolyte Nanometer Switch", IEEE Journal of Solid-State Circuits, Vol. 40, No. 1, p. 168-176, January 2005.

SUMMARY OF INVENTION

Technical Problem

However, in a crossbar circuit in which a large number of resistance variable elements are arranged in an array, it is often the case that a transistor for selecting a row and a column of an array unit is constituted of a unipolar transistor such as an N-type FET or a P-type FET in terms of layout constraints. For example, as illustrated in FIG. 10A, a case that a row and a column of a crossbar circuit are controlled by using an N-type FET is considered. A voltage difference occurs from a product of a current flowing when a writing or erasing operation is performed, and a resistance, and a source potential Vs of a transistor (N-type selection transistor) on a side where a positive voltage is applied to a resistance variable element R may float.

Specifically, in a case of FIG. 10A, when it is assumed that a writing current is Iprg, the source potential Vs becomes Iprg×R. In a case of an N-type selection transistor, a conductive type of a well becomes P type. A P-type transistor is connected to the ground (GND). The source potential Vs floats by Iprg×R, as compared with the GND potential. Therefore, since a substrate potential is decreased in view of the source, the circuit is brought to a state that a back bias (bias in a direction in which Vth (threshold voltage) increases) is applied to the N-type selection transistor.

On the other hand, similarly in a case of a P-type selection transistor constituted of an N-type semiconductor, a source potential is decreased by Vprg−Iprg×R, against an N-type substrate potential (in a case of FIG. 10A, Vprg). This state is a state that a substrate potential increases, as compared with a source potential, and a back bias (bias in a direction in which Vth increases) is applied similarly.

At this occasion, as illustrated in FIG. 10B, there occurs a problem that a writing current decreases, namely, current characteristics (Ids) of the N-type selection transistor are deteriorated, as compared with current characteristics of a state (Vs=0V) in which a reverse bias is not applied. When this problem is tried to be avoided by designing a gate length or width of an N-type transistor, it is necessary to considerably increase the gate width. Consequently, there occurs a problem that layout efficiency is deteriorated. This problem is similar even in a case where a column and a row of a crossbar circuit are controlled by using a P-type FET.

Considering the above-described issue, an object of the present invention is to provide a semiconductor device which improves current characteristics in writing and reading a selection element, and suppresses an increase in layout area.

Solution to Problem

A semiconductor device according to the present invention, comprises: a variable-resistance type first switch including a first terminal and a second terminal, and configured in such a way that a resistance state changes by applying a voltage between the first and second terminals; a variable-resistance type second switch including a third terminal and a fourth terminal, forming an intermediate node by connection of the third terminal to the second terminal, and configured in such a way that a resistance state changes by applying a voltage between the third and fourth terminals; a first wiring connected to the first terminal; a second wiring connected to the fourth terminal, and extending in a direction crossing the first wiring in a planar view; a first selection transistor connected to the first wiring, a second selection transistor connected to the second wiring; a first well terminal connection line to which a well terminal of the first selection transistor is connected; and a second well terminal connection line to which a well terminal of the second selection transistor is connected, wherein the first well terminal connection line and the second well terminal connection line are electrically insulated.

In addition, a semiconductor device according to the present invention, comprises: a two terminal element including a first terminal and a second terminal; a first wiring connected to the first terminal, a second wiring connected to the second terminal, and extending in a direction crossing the first wiring in a planar view, a first selection transistor connected to the first wiring; a second selection transistor connected to the second wiring; a first well terminal connection line to which a well terminal of the first selection transistor is connected; and a second well terminal connection line to which a well terminal of the second selection transistor is connected, wherein the first well terminal connection line and the second well terminal connection line are electrically insulated.

Advantageous Effect of Invention

According to the present invention, it is possible to provide a semiconductor device which improves current characteristics in writing and reading a selection element, and suppresses an increase in layout area.

EXAMPLE EMBODIMENT

Next, example embodiments of the present invention are described with reference to the drawings.

Before describing the present example embodiments in detail, meanings of terms relating to the present example embodiments are described.

(Description on Bipolar Type Switch and Unipolar Type Switch)

(Unipolar Type Switch)

A unipolar type switch is a switching element in which an OFF-state (high resistance state) and an ON-state (low resistance state) are switched in response to an applied voltage value.

Operation characteristics of the unipolar type switch are described by using FIGS. 1A to 1D. FIGS. 1A to 1D are diagrams illustrating operation characteristics of the unipolar type switch.

Figure 1A:
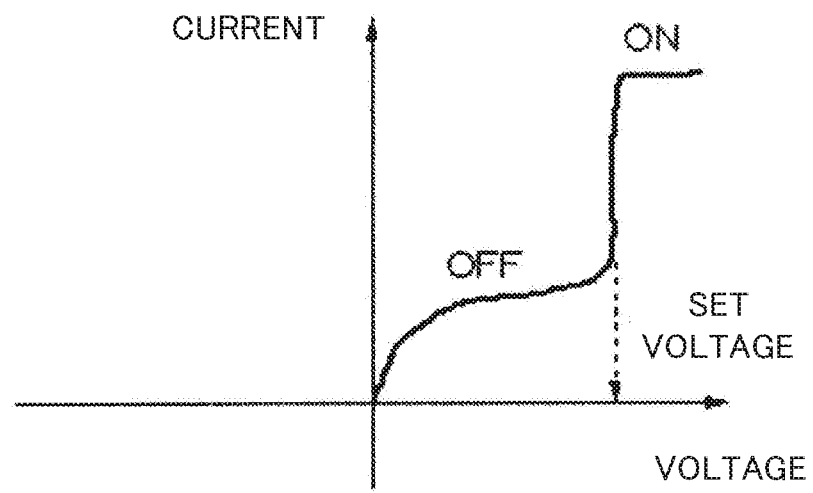
FIG. 1A is a diagram illustrating that regarding operation characteristics of a unipolar type switch, when a positive voltage of a first electrode exceeds a set voltage, the switch shifts from an OFF-state to an ON-state.

As the unipolar type switch, a configuration in which a resistance variable layer is interposed by using a first electrode and a second electrode is considered. A positive voltage is applied to the first electrode. When the applied positive voltage exceeds a predetermined set voltage, the unipolar type switch shifts from an OFF-state to an ON-state (FIG. 1A).

Note that the set voltage is a characteristic value, which is determined depending on a film thickness, a composition, a density, or the like of a resistance variable layer, together with a reset voltage to be described later. Further, a voltage at which a resistance value of the resistance variable layer shifts from a high resistance OFF-state to a low resistance ON-state is the set voltage. Conversely, a voltage at which a resistance value of the resistance variable layer shifts from an ON-state to an OFF-state is a reset voltage.

Figure 1B:
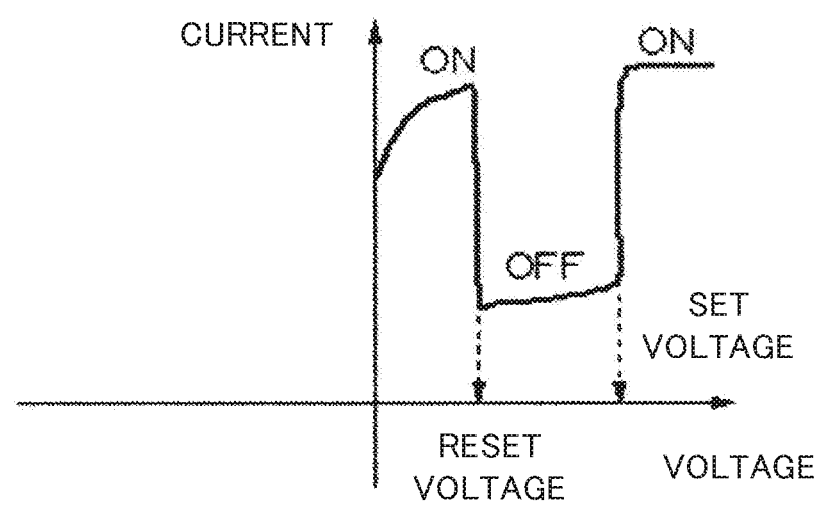
FIG. 1B is a diagram illustrating that regarding operation characteristics of the unipolar type switch, when the positive voltage of the first electrode further exceeds the set voltage after the switch shifts to an OFF-state, the switch shifts again from the OFF-state to an ON-state.

When a positive voltage larger than the reset voltage is applied to the unipolar type switch in an ON-state, the unipolar type switch shifts from the ON-state to an OFF-state. When the value of the positive voltage exceeds the set voltage by further increasing the applied voltage, the unipolar type switch shifts from the OFF-state to an ON-state again (FIG. 1B).

Figure 1C:
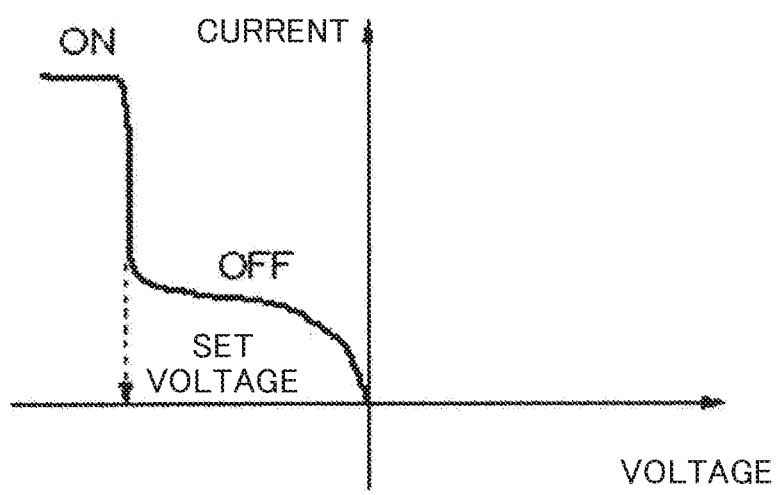
FIG. 1C is a diagram illustrating that regarding operation characteristics of the unipolar type switch, when a negative voltage of the first electrode exceeds a set voltage, the switch shifts from an OFF-state to an ON-state.

On the other hand, a negative voltage is applied to the first electrode. When the value of the negative voltage exceeds a predetermined set voltage, the unipolar type switch shifts from an OFF-state to an ON-state (FIG. 1C).

Figure 1D:
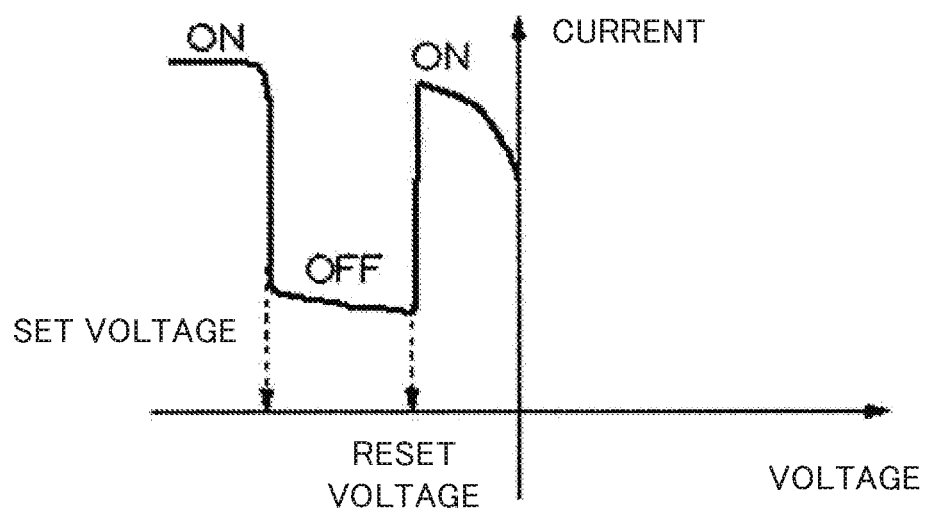
FIG. 1D is a diagram illustrating that regarding operation characteristics of the unipolar type switch, when the negative voltage of the first electrode further exceeds the set voltage after the switch shifts to an OFF-state, the switch shifts again from the OFF-state to an ON-state.

A negative voltage larger than the reset voltage is applied to the unipolar type switch in the ON-state. When the value of the negative voltage being applied to the first electrode exceeds the reset voltage, the unipolar type switch shifts from the ON-state to an OFF-state. When the value of the negative voltage exceeds the set voltage by further increasing the applied voltage, the unipolar type switch shifts from the OFF-state to an ON-state again (FIG. 1D).

In this way, the unipolar type switch does not depend on a polarity of an applied voltage, and depends only on a voltage value. Further, the unipolar type switch has a feature that the unipolar type switch exhibits resistance change characteristics illustrated in FIGS. 1A and 1B, and resistance change characteristics illustrated in FIGS. 1C and 1D.

(Bipolar Type Switch)

Unlike the unipolar type switch, a bipolar type switch is a switching element in which an OFF-state and an ON-state are switched in response to a polarity of a voltage to be applied.

FIG. 2 is a diagram illustrating operation characteristics of the bipolar type switch. It is assumed that the bipolar type switch has a structure in which an ion conductor functioning as a resistance variable layer is interposed by using a first electrode and a second electrode. Further, a positive voltage is applied to the first electrode. When a voltage value exceeds a set voltage, the bipolar type switch shifts from an OFF-state to an ON-state (FIG. 2A). Hereinafter, such a voltage application condition is defined as forward bias.

Figure 2A:
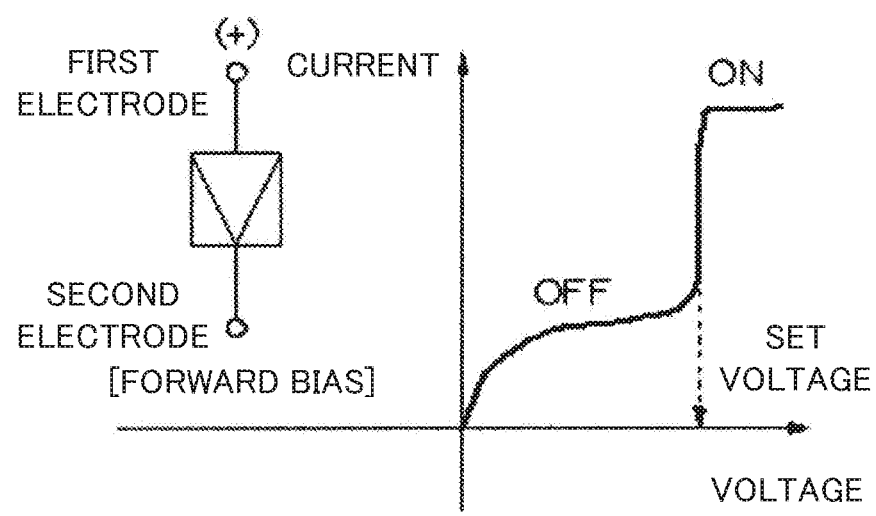
FIG. 2A is a diagram illustrating that regarding operation characteristics of a bipolar type switch, when a positive voltage of a first electrode exceeds a set voltage, the switch shifts from an OFF-state to an ON-state.
Figure 2B:
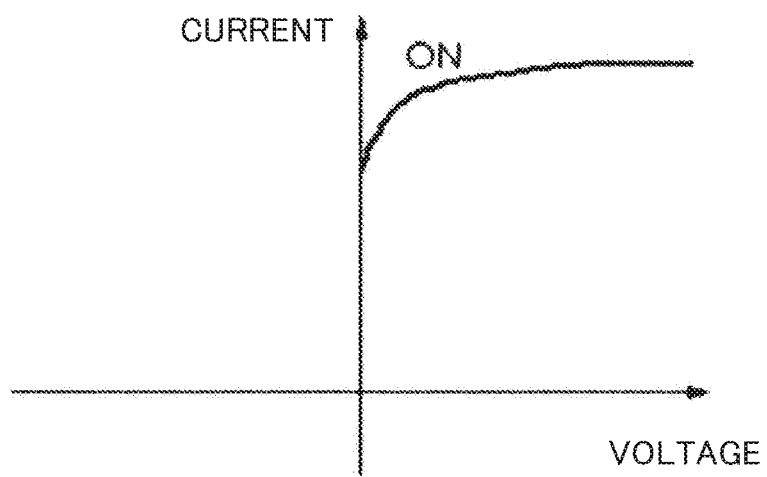
FIG. 2B is a diagram illustrating regarding operation characteristics of the bipolar type switch, when the positive voltage of the first electrode is further increased, the switch exhibits ohmic current-voltage characteristics.

Next, when the applied voltage is increased, the bipolar type switch exhibits ohmic current-voltage characteristics (FIG. 2B).

Figure 2C:
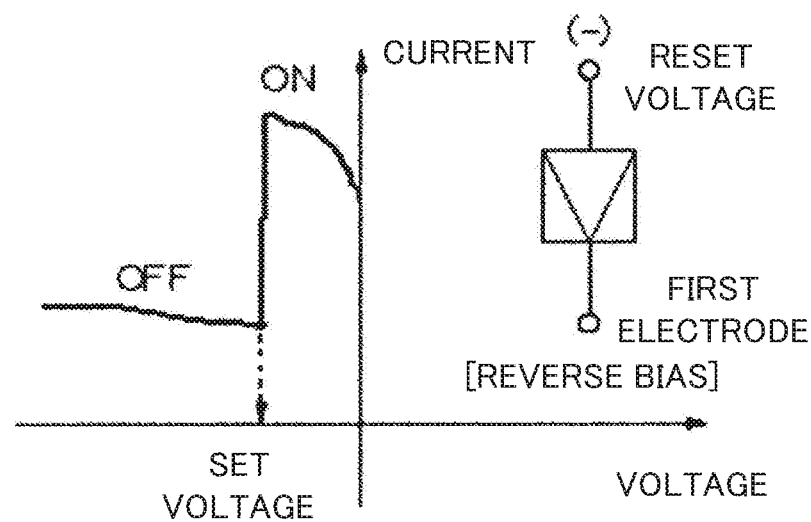
FIG. 2C is a diagram illustrating that regarding operation characteristics of the bipolar type switch, when a negative voltage of the first electrode exceeds a reset voltage, the switch shifts from an ON-state to an OFF-state.

Next, a negative voltage is applied to the first electrode. When the voltage value exceeds a reset voltage, the bipolar type switch shifts from an ON-state to an OFF-state (FIG. 2C). Hereinafter, such a voltage application condition is defined as reverse bias.

Figure 2D:
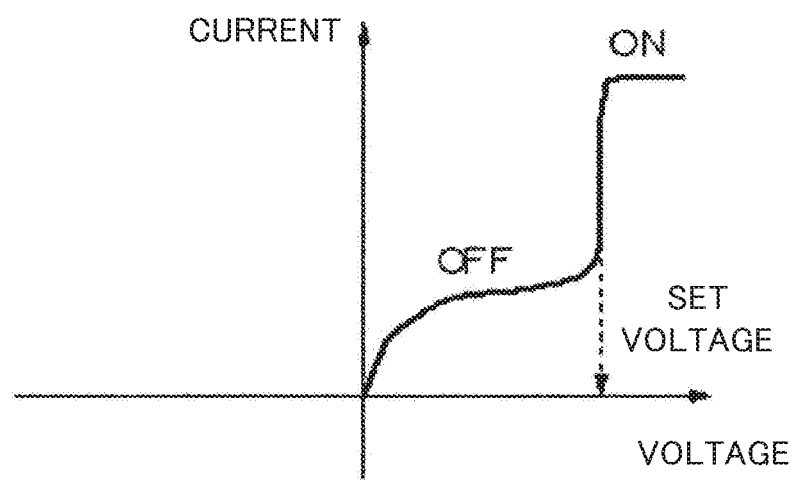
FIG. 2D is a diagram illustrating that regarding operation characteristics of the bipolar type switch, when the positive voltage of the first electrode exceeds the set voltage, the switch shifts from an OFF-state to an ON-state.

Further, a positive voltage is applied again to the first electrode of the bipolar type switch in the OFF-state. Furthermore, when the voltage value exceeds the set voltage, the bipolar type switch shifts from the OFF-state to an ON-state (FIG. 2D). In this way, in the bipolar type switch, an OFF-state and an ON-state are switched in response to a polarity of an applied voltage.

(Definition of Electrode in Bipolar Type Switch)

Herein, an electrode for use in a bipolar type switch is defined. As illustrated in FIG. 2A, an electrode which applies a positive voltage for applying a forward bias that shifts a switching element from an OFF-state to an ON-state is defined as a plus electrode. Conversely, an electrode which relatively applies a positive potential in bringing the switching element to an OFF-state by applying a bias in an opposite direction to the switching element is defined as a negative electrode.

Note that, for convenience of explanation, description has been made based on a premise that a condition, on which an OFF-state and an ON-state of a resistance variable switch element being one example of a bipolar type switch or a unipolar type switch are switched, is an applied voltage value. However, a condition on which an OFF-state and an ON-state of a resistance variable switch element are switched is not limited to the above. A condition on which an OFF-state and an ON-state of a resistance variable switch element are switched may be, for example, applied current, a voltage application continuation time, a current application continuation time, or the like. The below-described example embodiments can also be implemented by a resistance variable switch element having the above-described various conditions.

First Example Embodiment

Figure 3:
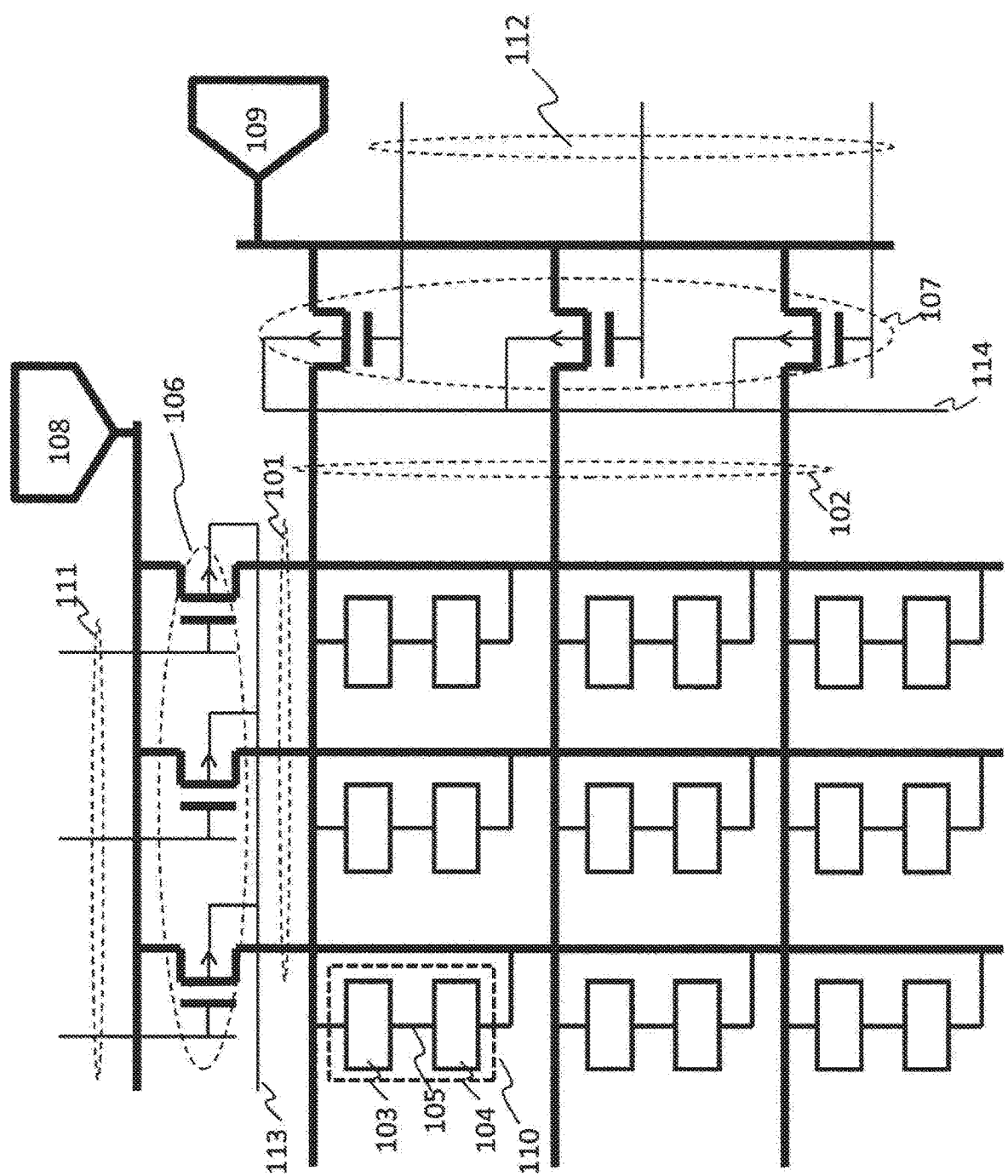
FIG. 3 is a diagram illustrating one example of a configuration of a semiconductor device according to a first example embodiment of the present invention.

A first example embodiment of the present invention is described. FIG. 3 is a diagram illustrating one example of a configuration of a semiconductor device according to the first example embodiment.

In the semiconductor device, a first wiring 101, a second wiring 102, a first switch element 104, a second switch element 103, a first selection transistor 106 and a second selection transistor 107 are disposed in an array shape. Further, the semiconductor device includes a first programming driver 108 and a second programming driver 109. The first wiring 101 and the second wiring 102 are disposed in directions crossing each other in a planar view, for example, in such a way as to perpendicularly cross with each other in a planar view. The first switch element 104 and the second switch element 103 are disposed in such a way as to be connected in series with respect to an intersection point between the first wiring 101 and the second wiring 102.

Herein, one of terminals in the first switch element 104 is connected to the first wiring 101. Further, one of terminals in the second switch element 103 is connected to the second wiring 102. Furthermore, another of the terminals in the first switch element 104, and another of the terminals in the second switch element 103 are connected to each other. A portion where another of the terminals in the first switch element 104 and another of the terminals in the second switch element 103 are connected forms an intermediate node 105. A combination of the first switch element 104 and the second switch element 103 constitutes one unit element 110. Each of the unit elements 110 is disposed in a matrix shape at each of the intersection points between the first wiring 101 and the second wiring 102. Herein, being disposed in a matrix shape means a state that each of the unit elements 110 are arranged in a rectangular shape along a row (horizontal direction) and a column (vertical direction).

Further, the first programming driver 108 is connected to the first wiring 101 via the first selection transistor 106. Further, the second programming driver 109 is connected to the second wiring 102 via the second selection transistor 107. Furthermore, a gate terminal of the first selection transistor 106 is connected to a first decode wiring 111. Moreover, a gate terminal of the second selection transistor 107 is connected to a second decode wiring 112. Further, well terminals of the first selection transistors 106 are commonly connected to a first well terminal connection line 113. Furthermore, well terminals of the second selection transistors 107 are commonly connected to a second well terminal connection line 114.

Herein, the first programming driver 108 supplies a programming voltage Vprg. Further, the second programming driver 109 supplies a ground voltage (0V). Furthermore, a voltage at which the first selection transistor 106 is brought to a conductive state is applied to one of the first decode wirings 111. Moreover, a voltage at which the second selection transistor 107 is brought to a conductive state is applied to one of the second decode wirings 112. It is assumed that control is performed in such a way that a voltage at which the first and second selection transistors 106 and 107 are brought to a non-conductive state is applied to the first and second decode wirings 111 and 112, to which a voltage at which the first and second selection transistors 106 and 107 are brought to a conductive state is not applied, among the first and second decode wirings 111 and 112.

Then, the programming voltage Vprg is supplied from the first programming driver 108 to the unit element 110 being disposed at only one intersection point in a crossbar circuit of FIG. 3. At this occasion, when current (Iprg) flows to the unit element 110 having a resistance value R, a potential of the first decode wiring 111 increases by Iprg×R.

The increase in the potential results in increasing a source potential of the first selection transistor 106. Consequently, a well potential viewed from the source potential of the first selection transistor 106 is decreased. In order to avoid this state, an action of decreasing a conductance of the first selection transistor 106 is taken. In the present example embodiment, control of increasing a well potential by applying a bias having a positive potential to the first well terminal connection line 113 is performed. Consequently, the increase in the source potential is eliminated. By performing this control, it is possible to implement a secure programming operation, even when current flowing in the unit element 110 is increased.

Further, at this occasion, control is performed so that a potential of the second well terminal connection line 114 is lower than a potential of the first well terminal connection line 113. The potential of the second well terminal connection line 114 is desirably the same as or lower than the ground potential (0V) to be supplied by the second programming driver 109. Consequently, it is possible to suppress leak current generated in the second selection transistor 107 in a non-conductive state.

Further, in the present example embodiment, the first well terminal connection lines 113 which are commonly connected to the well terminals of the first selection transistors 106 and the second well terminal connection lines 114 which are commonly connected to the well terminals of the second selection transistors 107 are electrically insulated. Thus, it is possible to avoid a decrease in writing current, which is generated when a writing operation with respect to an element selected accompanied by execution of a programming operation is performed. Concurrently, it is also possible to improve current characteristics.

Note that, in the present example embodiment, description is made by way of an example in which the first and second selection transistors 106 and 107 are N-type field effect transistors. In a case of a P-type field effect transistor, control is performed so that a potential of the first well terminal connection line 113 is lower than a potential of the second well terminal connection line 114.

Figure 4:
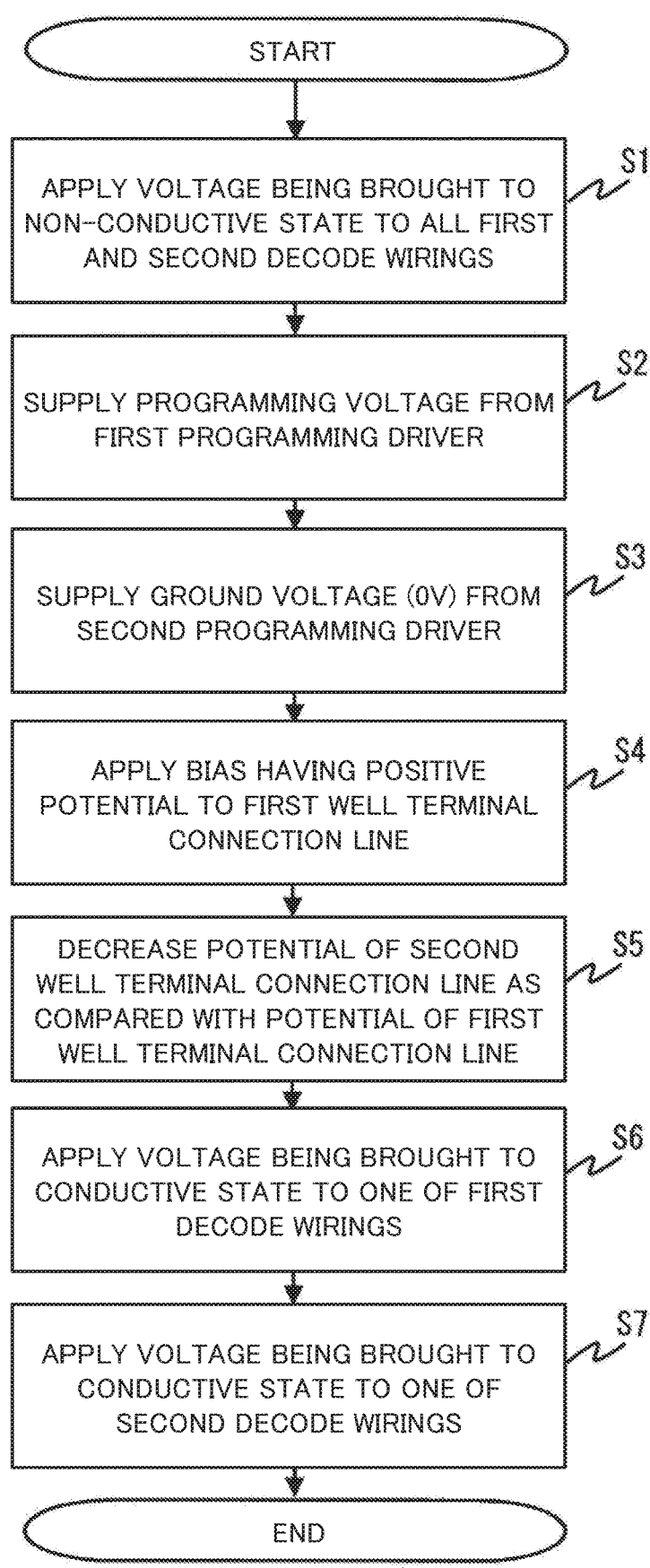
FIG. 4 is a flowchart illustrating a control method of the semiconductor device according to the first example embodiment.

Next, a control method of the semiconductor device according to the present example embodiment is described. FIG. 4 is a flowchart illustrating the control method of the semiconductor device according to the present example embodiment.

In the processing of Step S1, a voltage being brought to a non-conductive state is applied to all the first and second decode wirings 111 and 112. In the processing of Step S2, the programming voltage Vprg is supplied from the first programming driver 108. In the processing of Step S3, the ground voltage (0V) is supplied from the second programming driver 109.

In the processing of Step S4, control of increasing a well potential by applying a bias having a positive potential to the first well terminal connection line 113 is performed.

In the processing of Step S5, control is performed so that a potential of the second well terminal connection line 114 is lower than a potential of the first well terminal connection line 113.

In the processing of Step S6, a voltage being brought to a conductive state is applied to one of the first decode wirings 111 from the first selection transistor 106. In the processing of Step S7, a voltage being brought to a conductive state is applied to one of the second decode wirings 112 from the second selection transistor 107, and the processing finishes.

In the present example embodiment, it is assumed that, when the programming voltage Vprg is supplied from the first programming driver 108 to the unit element 110, which is disposed at an intersection point in a conductive state by the first decode wiring 111 and the second decode wiring 112, decreasing of a well potential viewed from a source potential of the first selection transistor 106 is suppressed. Specifically, a well potential is increased by applying a bias having a positive potential to the first well terminal connection line 113, and an increase in the source potential is eliminated. Thus, it is possible to implement a secure programming operation, even when current flowing in the unit element 110 is increased.

Second Example Embodiment

Figure 5:
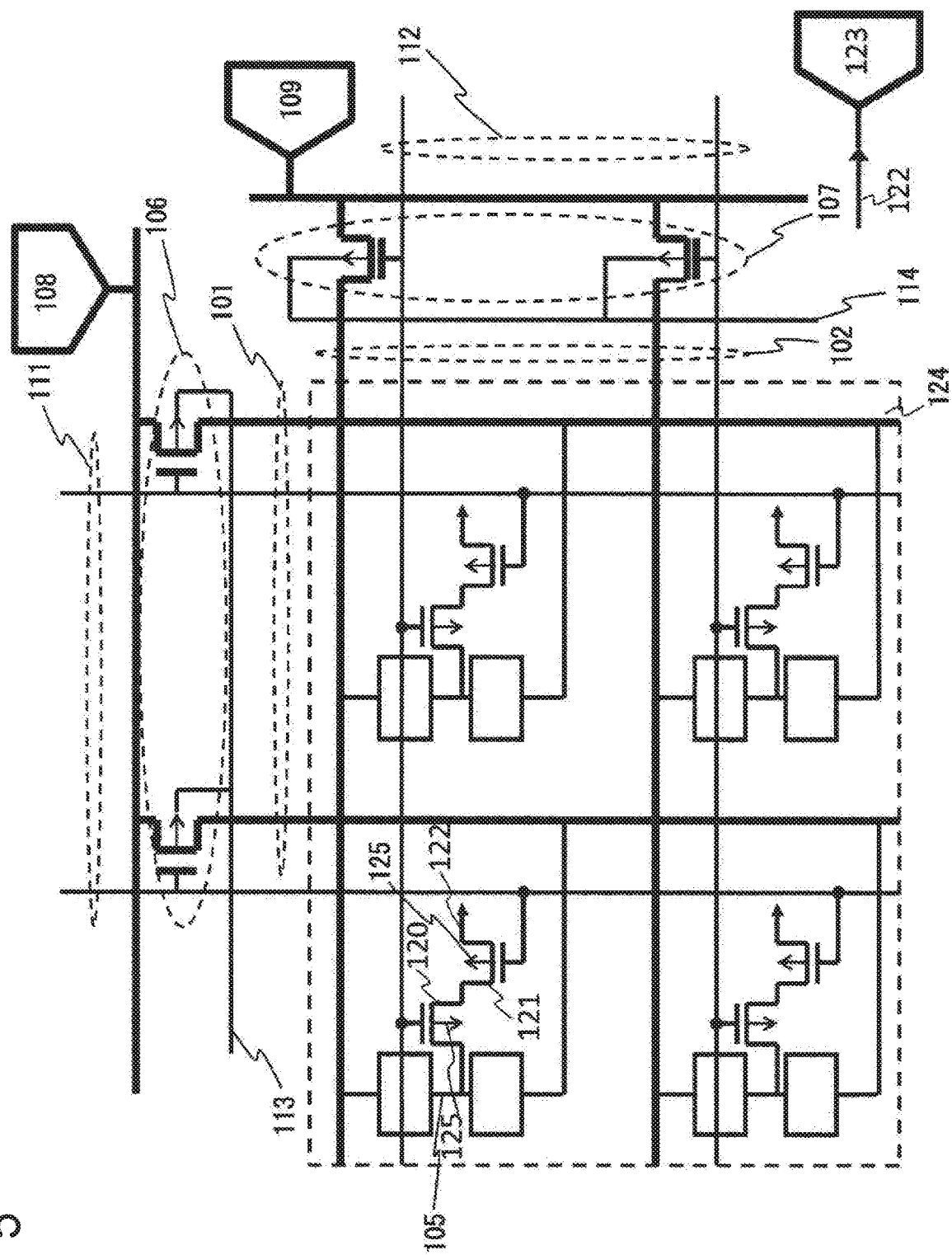
FIG. 5 is a diagram illustrating one example of a configuration of a semiconductor device according to a second example embodiment of the present invention.

FIG. 5 is a diagram illustrating one example of a configuration of a semiconductor device according to a second example embodiment. Description on a portion common to the first example embodiment is omitted. In the present example embodiment, either one of a source terminal or a drain terminal of a second intermediate node selection transistor 120 is connected to an intermediate node 105. Further, regarding the drain terminal or the source terminal of the second intermediate node selection transistor 120, a terminal that is not connected to the intermediate node 105 is connected to either one of a source terminal or a drain terminal of a first intermediate node selection transistor 121. Regarding the drain terminal or the source terminal of the first intermediate node selection transistor 121, a terminal that is not connected to the second intermediate node selection transistor 120 is connected to an intermediate node control line 122, which is commonly wired within an array 124.

The intermediate node control line 122 is configured to transmit a signal for controlling a voltage or a current of the intermediate node 105. The intermediate node control line 122 is connected to an intermediate node programming driver 123. A gate terminal of the second intermediate node selection transistor 120 is connected to a second decode wiring 112. A gate terminal of the first intermediate node selection transistor 121 is connected to a first decode wiring 111. Herein, well wirings 125 of the first and second intermediate node selection transistors 121 and 120 are commonly connected within the array 124.

The first and second intermediate node selection transistors 121 and 120 constitute an intermediate node selection circuit. The intermediate node selection circuit is provided for each of the intermediate nodes 105. The intermediate node selection circuit switches a connection state between the intermediate node control line 122 and the intermediate node 105. This switching is performed, based on a signal from the first decode wiring 111, which is connected to a gate terminal of the first intermediate node selection transistor 121, and a signal from the second decode wiring 112, which is connected to a gate terminal of the second intermediate node selection transistor 120.

Herein, the intermediate node programming driver 123 supplies a programming voltage Vprg. Further, first and second programming drivers 108 and 109 supply a ground voltage (0V). Furthermore, a voltage at which the first selection transistor 106 is brought to a conductive state is applied to one of the first decode wirings 111. Moreover, a voltage at which the second selection transistor 107 is brought to a conductive state is applied to one of the second decode wirings. It is assumed that control is performed in such a way that, regarding the first and second decode wirings 111 and 112, a potential at which the first and second selection transistors 106 and 107 are brought to a non-conductive state is applied to the first and second decode wirings 111 and 112, to which a voltage being brought to a conductive state is not applied.

Then, the programming voltage Vprg is supplied from the intermediate node programming driver 123 to the first intermediate node selection transistor 121, which constitutes an intermediate node selection circuit disposed at only one intersection point in a crossbar circuit of FIG. 5. At this occasion, when current (Iprg) flows to a unit element 110 having a resistance value R, a source potential of the second intermediate node selection transistor 120 increases by Iprg× R. Further, when it is assumed that a threshold voltage of the second intermediate node selection transistor 120 is Vthn, a source potential of the first intermediate node selection transistor 121 increases by Iprg×R+Vthn.

An increase in these potentials results in increasing source potentials of the first and second intermediate node selection transistors 121 and 120. Consequently, a well potential viewed from a source potential of the first intermediate node selection transistor 121 is decreased. Further, a well potential viewed from a source potential of the second intermediate node selection transistor 120 is decreased. In order to avoid this state, an action of decreasing conductance of the first and second intermediate node selection transistors 121 and 120 is taken. In the present example embodiment, control of increasing a well potential by applying a bias having a positive potential to the well wirings 125 of the first and second intermediate node selection transistors 121 and 120 is performed. Consequently, the increase in the source potential is eliminated. By performing this control, it is possible to implement a secure programming operation, even when current flowing in the unit element 110 is increased.

Further, at this occasion, control is performed so that potentials of first and second well terminal connection lines 113 and 114 are lower than potentials of the well wirings 125 of the first and second intermediate node selection transistors 121 and 120. The potentials of the first and second well terminal connection lines 113 and 114 are desirably the same as or lower than the ground potential (0V) to be supplied by the first and second programming drivers 108 and 109. Consequently, it is possible to suppress leak current generated in the first and second selection transistors 106 and 107 in a non-conductive state.

Further, in the present example embodiment, the well wirings 125, the first well terminal connection line 113, and the second well terminal connection line 114 are electrically insulated. The well wirings 125 are connected to well terminals of the first and second intermediate node selection transistors 121 and 120. The first well terminal connection line 113 is commonly connected to well terminals of the first selection transistors 106. The second well terminal connection line 114 is connected to a well terminal of the second selection transistor 107. Thus, it is possible to avoid a decrease in writing current, which is generated when a writing operation with respect to an element selected accompanied by execution of a programming operation is performed. Concurrently, it is also possible to improve current characteristics.

Further, in the present example embodiment, it is possible to individually program first and second switch elements 104 and 103. In view of the above, the first and second switch elements 104 and 103 may be a unipolar type switch, a bipolar type switch, or combination of these switches. Furthermore, the first and second switch elements 104 and 103 may be a configuration being connected by aligning polarities of bipolar type switches. Moreover, the first and second switch elements 104 and 103 may be a configuration such that opposite polarities of bipolar type switches are connected to each other. Thus, an advantageous effect of enabling to flexibly handle characteristics of a switch element can be provided.

Herein, FIG. 6 illustrates an example of combination of switch elements constituting a unit element. FIG. 6A is an example in which a unipolar type switch having polarities is used alone. FIGS. 6B and 6C are examples in which a bipolar type switch having a one-directional polarity is used alone. FIG. 6D is an example in which bipolar type switches having a one-directional polarity are disposed in a direction in which the polarities of the switches are opposite to each other.

Figure 6A:
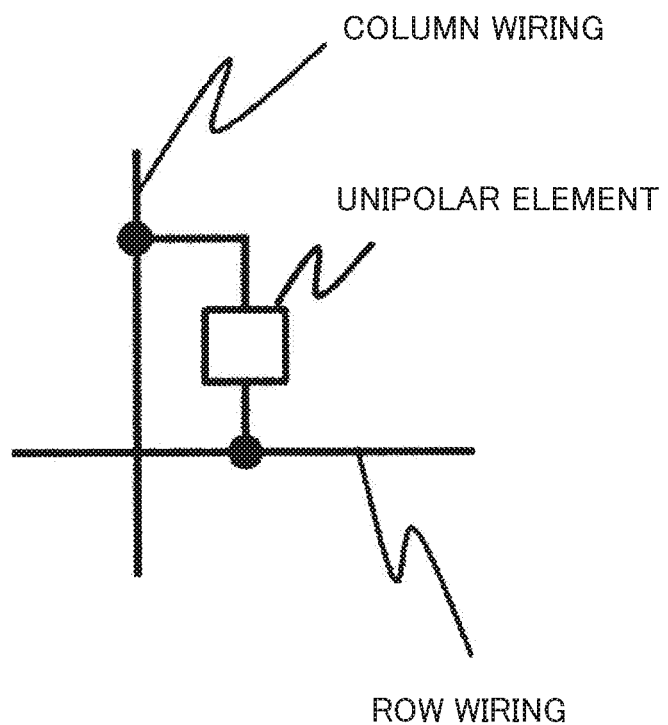
FIG. 6A is a diagram illustrating one example of combination of switch elements constituting a unit element.
Figure 6B:
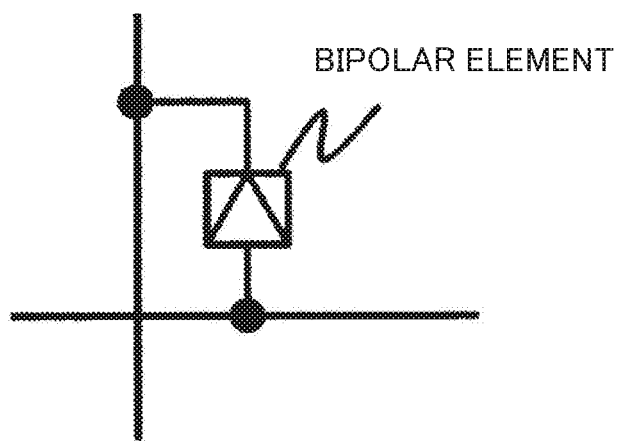
FIG. 6B is a diagram illustrating one example of combination of switch elements constituting a unit element.
Figure 6C:
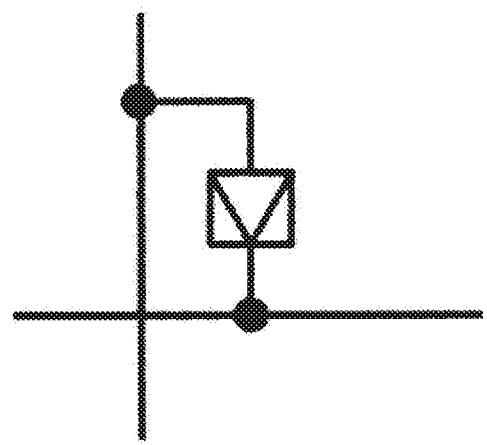
FIG. 6C is a diagram illustrating one example of combination of switch elements constituting a unit element.
Figure 6D:
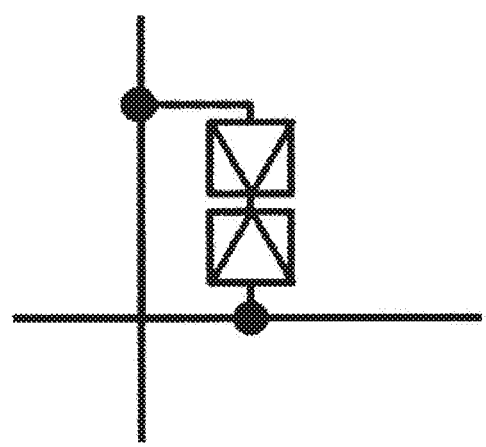
FIG. 6D is a diagram illustrating one example of combination of switch elements constituting a unit element.

In order to improve OFF reliability of the unit element 110, as illustrated in FIG. 6D, a layout in which bipolar type switches are combined in a direction in which the polarities of the switches are opposite to each other is more preferable. In the unit element 110 illustrated in FIG. 6D, even when a voltage is applied in a direction in which one of the switch elements is turned ON during operation, a voltage is applied to another of the switch elements in a direction in which the switch element is turned OFF. Therefore, an advantageous effect of reducing occurrence of an erroneous writing operation with respect to the unit element 110 is high.

In the present example embodiment, it is assumed that, when a programming voltage Vprg is supplied from the intermediate node programming driver 123 to the unit element 110, which is disposed at an intersection point in a conductive state by the first decode wiring 111 and the second decode wiring 112, decreasing of a well potential viewed from a source potential of the first intermediate node selection transistor 121 is suppressed. Specifically, a well potential is increased by applying a bias having a positive potential to the well wirings 125 of the first and second intermediate node selection transistors 121 and 120, and an increase in the source potential is eliminated. Thus, it is possible to implement a secure programming operation, even when current flowing in the unit element 110 is increased.

Third Example Embodiment

Figure 7:
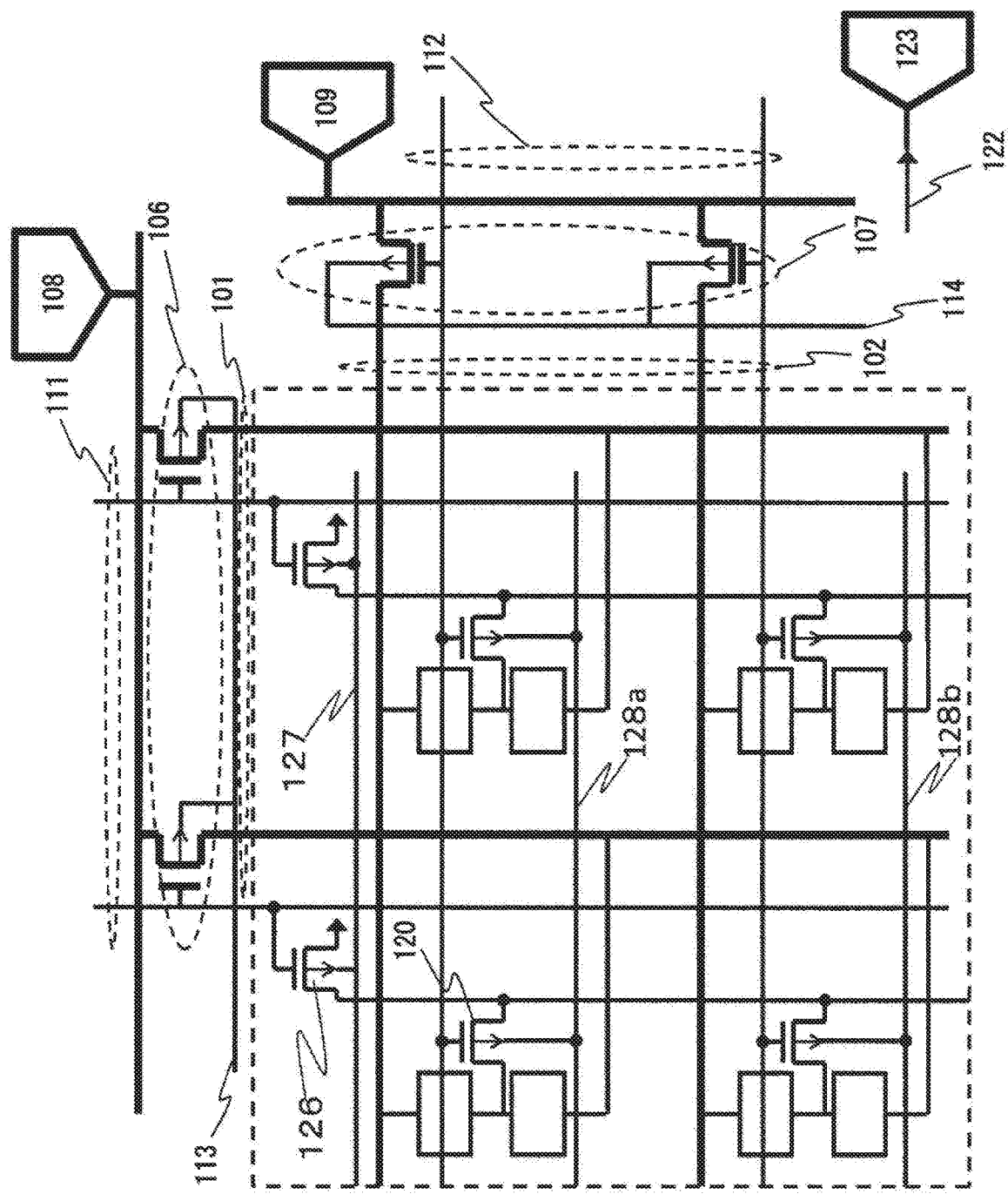
FIG. 7 is a diagram illustrating one example of a configuration of a semiconductor device according to a third example embodiment of the present invention.

The present example embodiment is an example embodiment in which a number of transistors in an intermediate node selection circuit of the second example embodiment is further reduced. Regarding a first intermediate node selection transistor 121 and a second intermediate node selection transistor 120 constituting an intermediate node selection circuit, it is possible to aggregate and dispose transistors to be connected to a side of an intermediate node programming driver 123 in an area where a decode wiring is shared. FIG. 7 is a diagram illustrating one example of a configuration of a semiconductor device according to a third example embodiment. Regarding intermediate node selection transistors constituting each of intermediate node selection circuits, the first intermediate node selection transistors 121 which share a first decode wiring 111 are aggregated, and disposed as a sharing type intermediate node selection switch element 126. Further, a well wiring 127 of the sharing type intermediate node selection switch 126 is also commonly wired.

Specifically, a first intermediate node selection transistor 121 of a certain intermediate node selection circuit also serves as a first intermediate node selection transistor 121 of at least another one of the intermediate node selection circuits. Further, the first intermediate node selection transistor 121 of the certain intermediate node selection circuit is also connected to a second intermediate node selection transistor 120 of another intermediate node selection circuit.

The second intermediate node selection transistors 120 are disposed in a matrix shape in association with unit elements 110. In FIG. 7, well wirings 128a and 128b of the second intermediate node selection transistor 120 are commonly wired in a row direction for each row. Specifically, the well wirings 128a and 128b of the second intermediate node selection transistor 120 are commonly wired in a direction in parallel to a second decode wiring 112. Note that, in FIG. 7, although the well wirings 128a and 128b of the second intermediate node selection transistor 120 are commonly wired in a row direction, the well wirings 128a and 128b may be commonly wired in a column direction by interchanging a vertical direction and a horizontal direction.

In the case of FIG. 7, intermediate node selection transistors including a programming target are able to supply a well potential for each row. It is possible to control only a well potential of a transistor serving as a programming target, regarding a plurality of the second intermediate node selection transistors 120 to be commonly connected to the sharing type intermediate node selection switch element 126. By performing this control, it is possible to eliminate an influence on an intermediate node selection transistor, which is not a programming target. Further, it is possible to improve current characteristics by controlling only a well potential of an intermediate node selection transistor being a programming target.

In summary, a difference is made between a well potential of an intermediate node selection transistor being a programming target, and a well potential of an intermediate node selection transistor, which is not a programming target. Thus, transistor selectivity is improved. Further, it is possible to suppress occurrence of an erroneous writing operation of a program. Furthermore, as illustrated in FIG. 7, the well wiring 127 of the sharing type intermediate node selection switch element 126 and the first decode wiring 111 are disposed to be orthogonal to each other. Thus, it is possible to improve selectivity with respect to a second intermediate node selection transistor, which is not a selection target.

Figure 8A:
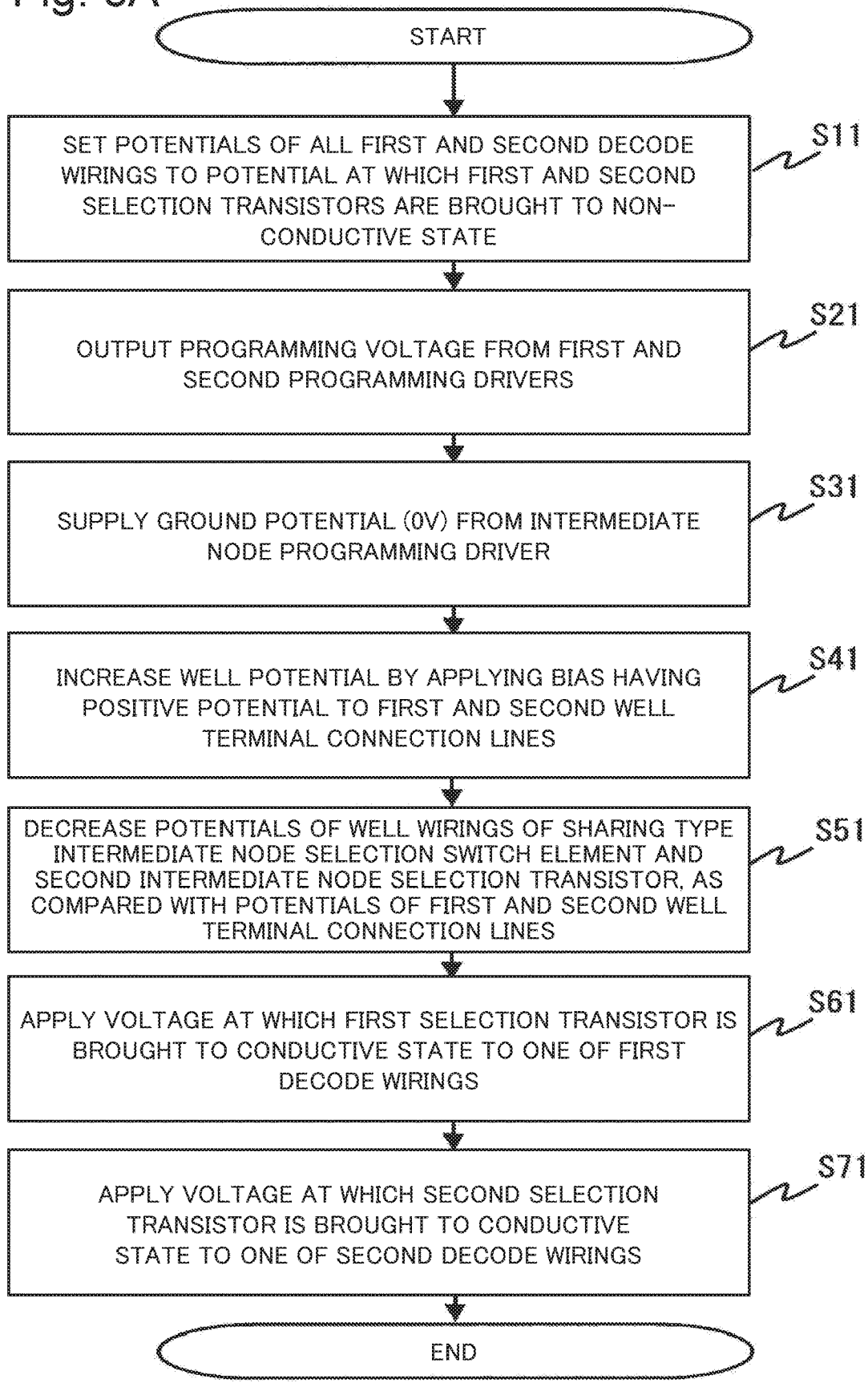
FIG. 8A is a flowchart illustrating a procedure of shifting a unit element from an OFF-state to an ON-state in a control method of the semiconductor device according to the third example embodiment.
Figure 8B:
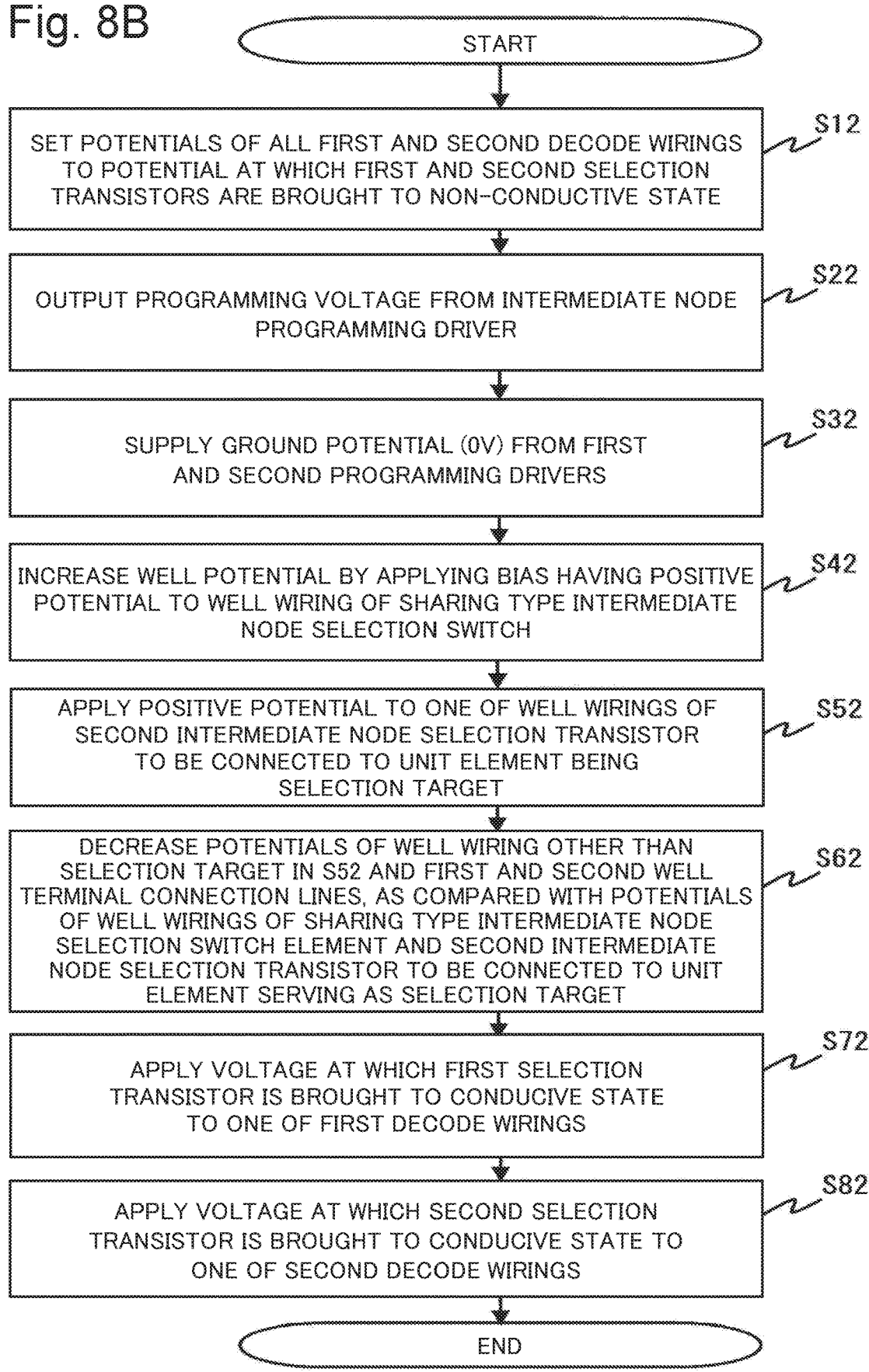
FIG. 8B is a flowchart illustrating a procedure of shifting a unit element from an ON-state to an OFF-state in the control method of the semiconductor device according to the third example embodiment.

Next, a control method of the semiconductor device according to the present example embodiment is described. FIGS. 8A and 8B are flowcharts illustrating the control method of the semiconductor device according to the present example embodiment. At this occasion, it is assumed that the unit elements 110 have a layout in which bipolar type switches having a one-directional polarity are combined in a direction in which the polarities of the switches are opposite to each other. Herein, description is made, based on a case that an electrode of a bipolar type switch connected to an intermediate node 105 is a negative electrode, an electrode of a bipolar type switch connected to a first wiring 101 and a second wiring 102 is a positive electrode, and first and second selection transistors 106 and 107 are N-type transistors.

First, a procedure of shifting a unit element from an OFF-state to an ON-state is described with reference to FIG. 8A. In the processing of Step S11, potentials with respect to all the first decode wirings 111 and the second decode wirings 112 are set to a potential (for example, a ground potential) at which the first and second selection transistors 106 and 107 are brought to a non-conductive state.

In the processing of Step S21, a programming voltage Vprg is output from first and second programming drivers 108 and 109.

In the processing of Step S31, the ground potential (0V) is supplied from the intermediate node programming driver 123.

In the processing of Step S41, control of increasing a well potential by applying a bias having a positive potential to first and second well terminal connection lines 113 and 114 is performed.

In the processing of Step S51, control is performed so that potentials of the well wiring 127 of the sharing type intermediate node selection switch element 126 and the well wirings 128a and 128b of the second intermediate node selection transistor 120 are lower than potentials of the first and second well terminal connection lines 113 and 114.

In Step S61, a voltage at which the first selection transistor 106 is brought to a conductive state is applied to one of the first decode wirings 111.

In the processing of Step S71, a voltage at which the second selection transistor 107 is brought to a conductive state is applied to one of the second decode wirings 112.

By performing the above-described processing, it is possible to shift a unit element from an OFF-state to an ON-state by uniquely selecting a unit element disposed in a matrix shape, and eliminating an influence that source potentials of the first and second selection transistors 106 and 107 float.

Note that, herein, each pair of the processing of S21 and the processing of S31, the processing of S41 and the processing of S51, and the processing of S61 and the processing of S71 may be performed simultaneously, or the order of processing may be reversed.

Next, a procedure of shifting a unit element from an ON-state to an OFF-state is described with reference to FIG. 8B. In the processing of Step S12, potentials with respect to all the first decode wirings 111 and second decode wirings 112 are set to a potential (for example, a ground potential) at which the first and second selection transistors 106 and 107 are brought to a non-conductive state.

In the processing of Step S22, the programming voltage Vprg is output from the intermediate node programming driver 123.

In the processing of Step S32, the ground potential is supplied from the first and second programming drivers 108 and 109.

In the processing of Step S42, control of increasing a well potential by applying a bias having a positive potential to the well wiring 127 of the sharing type intermediate node selection switch element 126 is performed.

In the processing of Step S52, a positive potential is applied to one of well wirings of the second intermediate node selection transistor 120 to be connected to a unit element being a selection target.

In the processing of Step S62, control is performed so that potentials of a well wiring other than the selection target in Step S52 and the first and second well terminal connection lines 113 and 114 are lower than potentials of the well wiring 127 of the sharing type intermediate node selection switch element 126 and a well wiring 128 of the second intermediate node selection transistor 120 to be connected to a unit element serving as a selection target.

In the processing of Step S72, a voltage at which the first selection transistor 106 is brought to a conductive state is applied to one of the first decode wirings 111.

In the processing of Step S82, a voltage at which the second selection transistor 107 is brought to a conductive state is applied to one of the second decode wirings 112.

By performing the above-described processing, it is possible to shift a unit element from an ON-state to an OFF-state by uniquely selecting a unit element disposed in a matrix shape, and eliminating an influence that source potentials of first and second selection transistors float.

Herein, each pair of the processing of S22 and the processing of S32, the processing of S42 and the processing of S52 and the processing of S62, and the processing of S72 and the processing of S82 may be performed simultaneously, or the order of processing may be reversed.

Fourth Example Embodiment

Figure 9:
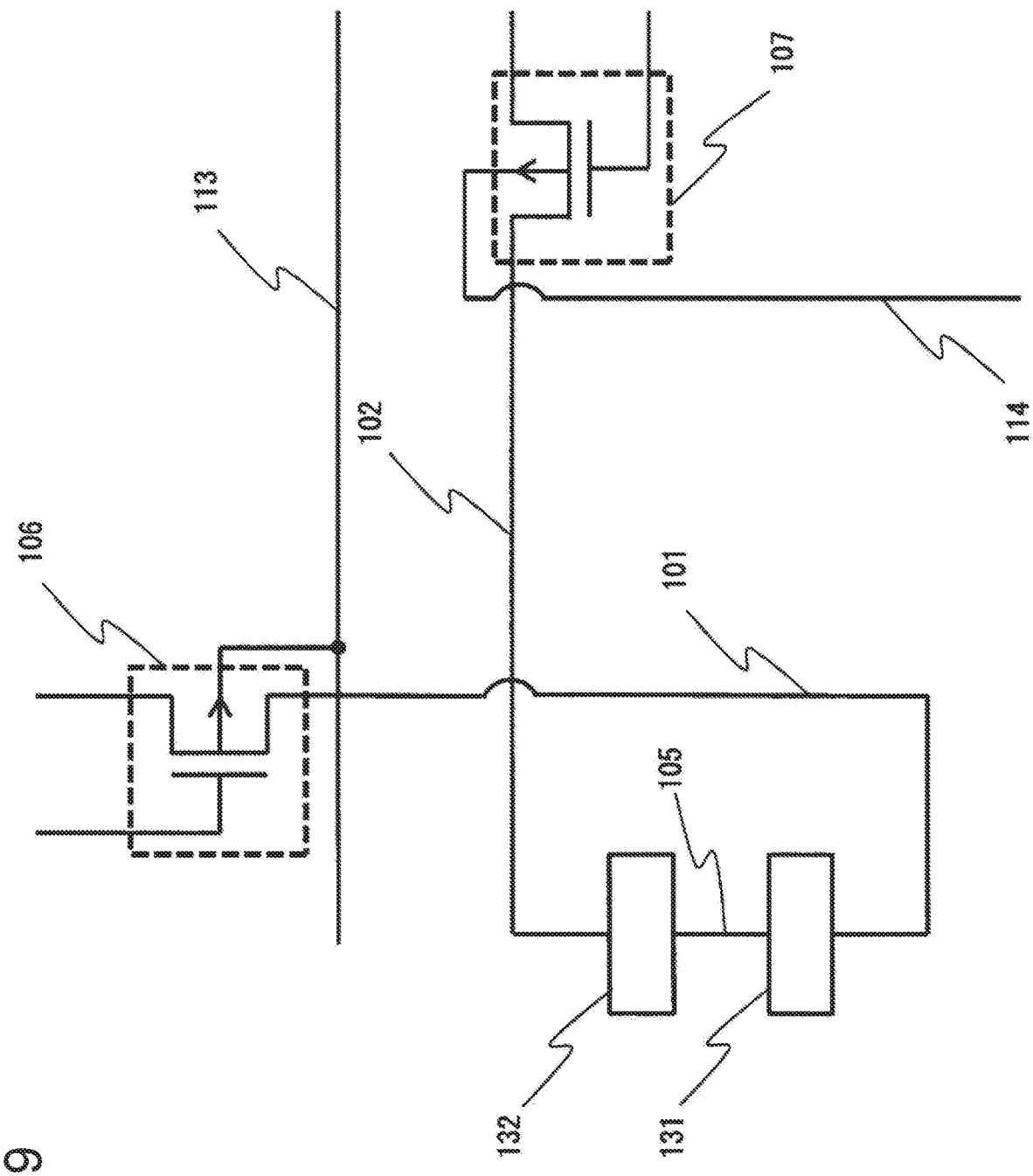
FIG. 9 is a diagram illustrating one example of a configuration of a semiconductor device according to a fourth example embodiment of the present invention.
Figure 10A:
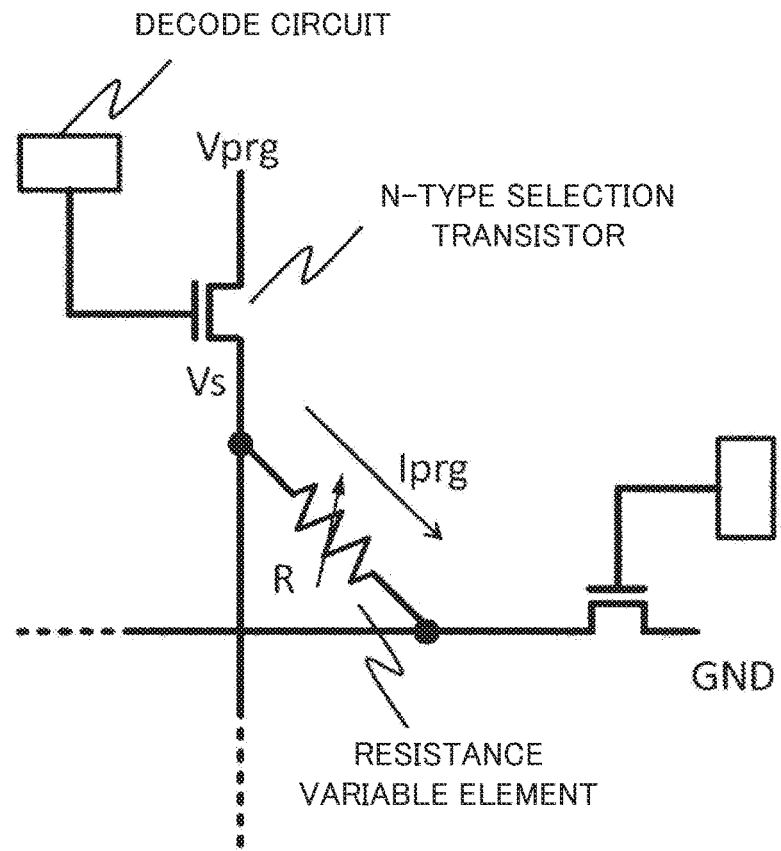
FIG. 10A is one example of a circuit diagram illustrating that a row and a column of a crossbar circuit are controlled by using an N-type FET.
Figure 10B:
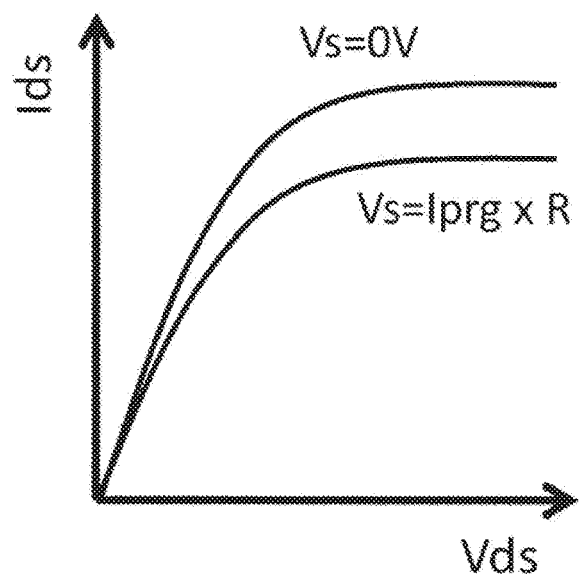
FIG. 10B is a diagram illustrating current characteristics of a state in which a reverse bias of a transistor on a side where a positive voltage is applied to a resistance variable element is not applied, and a state in which a reverse bias is applied.

A fourth example embodiment of the present invention is described. FIG. 9 is a diagram illustrating one example of a configuration of a semiconductor device according to the fourth example embodiment. The semiconductor device according to the present example embodiment includes a first switch 131, a second switch 132, a first wiring 101, a second wiring 102, a first selection transistor 106, a second selection transistor 107, a first well terminal connection line 113, and a second well terminal connection line 114.

The first switch 131 includes a first terminal and a second terminal. The first switch 131 is a variable-resistance type switch in which a resistance state changes by applying a voltage between the first and second terminals.

The second switch 132 includes a third terminal and a fourth terminal. The third terminal of the second switch 132 forms an intermediate node 105 by being connected to the second terminal of the first switch 131. The second switch 132 is a variable-resistance type switch in which a resistance state changes by applying a voltage between the third and fourth terminals.

The first wiring 101 is connected to the first terminal of the first switch 131. The second wiring 102 is connected to the fourth terminal of the second switch 132. The second wiring 102 extends in a direction crossing the first wiring 101 in a planar view.

The first selection transistor 106 is connected to the first wiring 101. The second selection transistor 107 is connected to the second wiring 102.

The first well terminal connection line 113 is connected to a well terminal of the first selection transistor 106. The second well terminal connection line 114 is connected to a well terminal of the second selection transistor 107. Further, the first well terminal connection line 113 and the second well terminal connection line 114 are electrically insulated.

In this way, in the present example embodiment, a terminal for controlling a well potential of a selection transistor is provided. Further, a well potential is increased by controlling the well potential of a predetermined selection transistor when a writing/reading operation is performed. Consequently, it becomes possible to eliminate an influence that a source potential floats.

Note that a program stored in an unillustrated storage unit of a semiconductor device may be provided by a recording medium, or may be provided via a network such as the Internet. The recording medium is a computer usable medium or a computer readable medium, and includes a medium capable of recording or reading information by using magnetism, light, electrons, electromagnetism, infrared light, or the like. Such a medium includes, for example, a semiconductor memory, a semiconductor or solid storage device, a magnetic tape, a detachable computer diskette, a Random Access Memory (RAM), a Read Only Memory (ROM), a magnetic disk, an optical disc, a magneto-optical disk, and the like.

While the invention has been particularly shown and described with reference to the example embodiments thereof, the invention is not limited to these embodiments. It will be understood by those of ordinary skill in the art that various changes in form and details may be made therein without departing from the spirit and scope of the present invention as defined by the claims.

The whole or part of the example embodiments disclosed above can be described as, but not limited to, the following supplementary notes.

[Supplementary Note 1]

A semiconductor device comprising:

a variable-resistance type first switch including a first terminal and a second terminal, and configured in such a way that a resistance state changes by applying a voltage between the first and second terminals;

a variable-resistance type second switch including a third terminal and a fourth terminal, forming an intermediate node by connection of the third terminal to the second terminal, and configured in such a way that a resistance state changes by applying a voltage between the third and fourth terminals;

a first wiring connected to the first terminal;

a second wiring connected to the fourth terminal, and extending in a direction crossing the first wiring in a planar view;

a first selection transistor connected to the first wiring;

a second selection transistor connected to the second wiring;

a first well terminal connection line to which a well terminal of the first selection transistor is connected; and a second well terminal connection line to which a well terminal of the second selection transistor is connected, wherein the first well terminal connection line and the second well terminal connection line are electrically insulated.

[Supplementary Note 2]

The semiconductor device according to supplementary note 1, wherein at least either a set of the first wiring, the first selection transistor, and a first decode signal line to be connected to the first selection transistor, or a set of the second wiring, the second selection transistor, and a second decode signal line to be connected to the second selection transistor is provided by one or more, and the semiconductor device comprises an array unit in which a unit element constituted of the first switch and the second switch is disposed in a matrix shape at each of intersection points between the first wiring and the second wiring.

[Supplementary Note 3]

The semiconductor device according to supplementary note 2, further comprising:

a first programming driver to be connected to the first wiring via the first selection transistor; and a second programming driver to be connected to the second wiring via the second selection transistor, wherein the semiconductor device comprises at least either a configuration in which the first programming driver is connected to a plurality of the first selection transistors, or a configuration in which the second programming driver is connected to a plurality of the second selection transistors.

[Supplementary Note 4]

The semiconductor device according to supplementary note 3, wherein a programming voltage is supplied from the first programming driver, a ground voltage is supplied from the second programming driver, a conductive voltage is applied from the first selection transistor to one of the first wirings, and a conductive voltage is not applied from the first selection transistor to a wiring other than the one wiring, a conductive voltage is applied from the second selection transistor to one of the second wirings, and a conductive voltage is not applied from the second selection transistor to a wiring other than the one wiring, and, when the programming voltage is supplied from the first programming driver to the one wiring to which a conductive voltage is applied from the first and second selection transistors, a bias having a positive potential is applied to the first well terminal connection line and causes a potential of the second well terminal connection line to be lower than a potential of the first well terminal connection line to which the bias having the positive potential is applied.

[Supplementary Note 5]

The semiconductor device according to supplementary note 3, wherein a programming voltage is supplied from the first programming driver, a ground voltage is supplied from the second programming driver, a conductive voltage is applied from the first selection transistor to one of the first wirings, and a conductive voltage is not applied from the first selection transistor to a wiring other than the one wiring, a conductive voltage is applied from the second selection transistor to one of the second wirings, and a conductive voltage is not applied from the second selection transistor to a wiring other than the one wiring, and, when the programming voltage is supplied from the first programming driver to the one wiring to which a conductive voltage is applied from the first and second selection transistors, a bias lower than the programming voltage is applied to the second well terminal connection line and causes a potential of the first well terminal connection line to be higher than a potential of the second well terminal connection line to which a bias lower than the programming voltage is applied.

[Supplementary Note 6]

The semiconductor device according to any one of supplementary notes 3 to 5, further comprising an intermediate node selection circuit for switching a connection state between an intermediate node control line for transmitting a signal to control a voltage or a current of the intermediate node and the intermediate node, for each of the intermediate nodes, wherein the intermediate node selection circuit switches a connection state between the intermediate node control line and the intermediate node, based on a signal from a first decode signal line to be connected to the first selection transistor, and a signal from a second decode signal line to be connected to the second selection transistor.

[Supplementary Note 7]

The semiconductor device according to supplementary note 6, wherein the intermediate node selection circuit includes a first intermediate node selection transistor and a second intermediate node selection transistor, the first intermediate node selection transistor includes a fifth terminal, a sixth terminal, and a first gate terminal, the second intermediate node selection transistor includes a seventh terminal, an eighth terminal, and a second gate terminal, the fifth terminal is connected to the intermediate node control line, the sixth terminal and the seventh terminal are connected to each other, the eighth terminal is connected to the intermediate node, either the first gate terminal or the second gate terminal is connected to the first decode signal line, and another is connected to the second decode signal line, and a third well terminal connection line which is connected to a well terminal between the first intermediate node selection transistor and the second intermediate node selection transistor, the first well terminal connection line, and the second well terminal connection line are electrically insulated.

[Supplementary Note 8]

The semiconductor device according to supplementary note 7, further comprising an intermediate node programming driver to be connected to the intermediate node control line, wherein a programming voltage is supplied from the intermediate node programming driver, a ground voltage is supplied from the first and second programming drivers, a conductive voltage is applied from the first selection transistor to one of the first wirings, and a conductive voltage is not applied from the first selection transistor to a wiring other than the one wiring, a conductive voltage is applied from the second selection transistor to one of the second wirings, and a conductive voltage is not applied from the second selection transistor to a wiring other than the one wiring, and, when the programming voltage is supplied from the intermediate node programming driver to the one wiring to which a conductive voltage is applied from the first and second selection transistors, a bias having a positive potential is applied to the third well terminal connection line and causes a potential of each of the first and second well terminal connection lines to be lower than a potential of the third well terminal connection line to which the bias having the positive potential is applied.

[Supplementary Note 9]

The semiconductor device according to supplementary note 7 or 8, wherein at least either a set of the first wiring, the first selection transistor, and the first decode signal line, or a set of the second wiring, the second selection transistor, and the second decode signal line is provided by one or more, the semiconductor device comprises an array unit in which a unit element constituted of the first switch and the second switch is disposed in a matrix shape at each of intersection points between the first wiring and the second wiring, the second intermediate node selection transistor is provided for each of a plurality of the intermediate node selection circuits, and the first intermediate node selection transistor of one of the intermediate node selection circuits also serves as the first intermediate node selection transistor of at least another of the intermediate node selection circuits, and is also connected to the second intermediate node selection transistor of the another intermediate node selection circuit.

[Supplementary Note 10]

The semiconductor device according to any one of supplementary notes 7 to 9, wherein the second intermediate node selection transistor is disposed in a matrix shape in association with the unit element, and a fourth well terminal connection line which is connected to a well terminal of the second intermediate node selection transistor is commonly wired only in a row direction or a column direction.

[Supplementary Note 11]

The semiconductor device according to any one of supplementary notes 7 to 9, wherein the second intermediate node selection transistor is disposed in a matrix shape in association with the unit element, and a fifth well terminal connection line which is connected to a well terminal of the first intermediate node selection transistor is commonly wired only in a direction orthogonal to the first decode signal line.

[Supplementary Note 12]

The semiconductor device according to any one of supplementary notes 1 to 11, wherein the first switch and the second switch are each a bipolar resistance variable element, and a unit element constituted of the first switch and the second switch forms the intermediate node by connecting terminals having a same polarity to each other.

[Supplementary Note 13]

A semiconductor device comprising:

a two terminal element including a first terminal and a second terminal;

a first wiring connected to the first terminal, a second wiring connected to the second terminal, and extending in a direction crossing the first wiring in a planar view, a first selection transistor connected to the first wiring;

a second selection transistor connected to the second wiring;

a first well terminal connection line to which a well terminal of the first selection transistor is connected; and a second well terminal connection line to which a well terminal of the second selection transistor is connected, wherein the first well terminal connection line and the second well terminal connection line are electrically insulated.

[Supplementary Note 14]

A control method for a semiconductor device provided with a variable-resistance type first switch including a first terminal and a second terminal, and configured in such a way that a resistance state changes by applying a voltage between the first and second terminals, a variable-resistance type second switch including a third terminal and a fourth terminal, forming an intermediate node by connection of the third terminal to the second terminal, and configured in such a way that a resistance state changes by applying a voltage between the third and fourth terminals, a first wiring connected to the first terminal, a second wiring connected to the fourth terminal, and extending in a direction crossing the first wiring in a planar view, a first selection transistor connected to the first wiring, a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, the control method comprising:

a step of supplying a programming voltage from the first programming driver;

a step of supplying a ground voltage from the second programming driver;

a step of applying a conductive voltage from the first selection transistor to one of the first wirings, and not applying a conductive voltage from the first selection transistor to a wiring other than the one wiring;

a step of applying a conductive voltage from the second selection transistor to one of the second wirings, and not applying a conductive voltage from the second selection transistor to a wiring other than the one wiring;

a step of, when the programming voltage is supplied from the first programming driver to the one wiring to which a conductive voltage is applied from the first and second selection transistors, applying a bias having a positive potential to the first well terminal connection line; and a step of causing a potential of the second well terminal connection line to be lower than a potential of the first well terminal connection line to which the bias having the positive potential is applied.

[Supplementary Note 15]

A control method for a semiconductor device provided with a variable-resistance type first switch including a first terminal and a second terminal, and configured in such a way that a resistance state changes by applying a voltage between the first and second terminals, a variable-resistance type second switch including a third terminal and a fourth terminal, forming an intermediate node by connection of the third terminal to the second terminal, and configured in such a way that a resistance state changes by applying a voltage between the third and fourth terminals, a first wiring connected to the first terminal, a second wiring connected to the fourth terminal, and extending in a direction crossing the first wiring in a planar view, a first selection transistor connected to the first wiring, a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, the control method comprising:

a step of supplying a programming voltage from the first programming driver;

a step of supplying a ground voltage from the second programming driver;

a step of applying a conductive voltage from the first selection transistor to one of the first wirings, and not applying a conductive voltage from the first selection transistor to a wiring other than the one wiring;

a step of applying a conductive voltage from the second selection transistor to one of the second wirings, and not applying a conductive voltage from the second selection transistor to a wiring other than the one wiring;

a step of, when the programming voltage is supplied from the first programming driver to the one wiring to which a conductive voltage is applied from the first and second selection transistors, applying a bias to lower than the programming voltage to the second well terminal connection line; and a step of causing a potential of the first well terminal connection line to be higher than a potential of the second well terminal connection line to which a bias lower than the programming voltage is applied.

[Supplementary Note 16]

A control method for a semiconductor device provided with a two terminal element including a first terminal and a second terminal, a first wiring connected to the first terminal, a second wiring connected to the second terminal, and extending in a direction crossing the first wiring in a planar view, a first selection transistor connected to the first wiring, a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, the control method comprising:

a step of supplying a programming voltage from the first programming driver;

a step of supplying a ground voltage from the second programming driver;

a step of applying a conductive voltage from the first selection transistor to one of the first wirings, and not applying a conductive voltage from the first selection transistor to a wiring other than the one wiring;

a step of applying a conductive voltage from the second selection transistor to one of the second wirings, and not applying a conductive voltage from the second selection transistor to a wiring other than the one wiring;

a step of, when the programming voltage is supplied from the first programming driver to the one wiring to which a conductive voltage is applied from the first and second selection transistors, applying a bias having a positive potential to the second well terminal connection line; and a step of causing a potential of the second well terminal connection line to be lower than a potential of the first well terminal connection line to which the bias having the positive potential is applied.

[Supplementary Note 17]

A control method for a semiconductor device provided with a two terminal element including a first terminal and a second terminal, a first wiring connected to the first terminal, a second wiring connected to the second terminal, and extending in a direction crossing the first wiring in a planar view, a first selection transistor connected to the first wiring, a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, the control method comprising:

a step of supplying a programming voltage from the first programming driver;

a step of supplying a ground voltage from the second programming driver;

a step of applying a conductive voltage from the first selection transistor to one of the first wirings, and not applying a conductive voltage from the first selection transistor to a wiring other than the one wiring;

a step of applying a conductive voltage from the second selection transistor to one of the second wirings, and not applying a conductive voltage from the second selection transistor to a wiring other than the one wiring;

a step of, when the programming voltage is supplied from the first programming driver to the one wiring to which a conductive voltage is applied from the first and second selection transistors, applying a bias lower than the programming voltage to the second well terminal connection line; and a step of causing a potential of the first well terminal connection line to be higher than a potential of the second well terminal connection line to which a bias lower than the programming voltage is applied.

[Supplementary Note 18]

A program causing a computer of a semiconductor device provided with a variable-resistance type first switch including a first terminal and a second terminal, and configured in such a way that a resistance state changes by applying a voltage between the first and second terminals, a variable-resistance type second switch including a third terminal and a fourth terminal, forming an intermediate node by connection of the third terminal to the second terminal, and configured in such a way that a resistance state changes by applying a voltage between the third and fourth terminals, a first wiring connected to the first terminal, a second wiring connected to the fourth terminal, and extending in a direction crossing the first wiring in a planar view, a first selection transistor connected to the first wiring;

a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, to execute:

processing of supplying a programming voltage from the first programming driver;

processing of supplying a ground voltage from the second programming driver;

processing of applying a conductive voltage from the first selection transistor to one of the first wirings, and not applying a conductive voltage from the first selection transistor to a wiring other than the one wiring;

processing of applying a conductive voltage from the second selection transistor to one of the second wirings, and not applying a conductive voltage from the second selection transistor to a wiring other than the one wiring;

processing of, when the programming voltage is supplied from the first programming driver to the one wiring to which a conductive voltage is applied from the first and second selection transistors, applying a bias having a positive potential to the first well terminal connection line; and processing of causing a potential of the second well terminal connection line to be lower than a potential of the first well terminal connection line to which the bias having the positive potential is applied.

[Supplementary Note 19]

A program causing a computer of a semiconductor device provided with a variable-resistance type first switch including a first terminal and a second terminal, and configured in such a way that a resistance state changes by applying a voltage between the first and second terminals, a variable-resistance type second switch including a third terminal and a fourth terminal, forming an intermediate node by connection of the third terminal to the second terminal, and configured in such a way that a resistance state changes by applying a voltage between the third and fourth terminals, a first wiring connected to the first terminal, a second wiring connected to the fourth terminal, and extending in a direction crossing the first wiring in a planar view, a first selection transistor connected to the first wiring, a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, to execute:

processing of supplying a programming voltage from the first programming driver;

processing of supplying a ground voltage from the second programming driver;

processing of applying a conductive voltage from the first selection transistor to one of the first wirings, and not applying a conductive voltage from the first selection transistor to a wiring other than the one wiring;

processing of applying a conductive voltage from the second selection transistor to one of the second wirings, and not applying a conductive voltage from the second selection transistor to a wiring other than the one wiring;

processing of, when the programming voltage is supplied from the first programming driver to the one wiring to which a conductive voltage is applied from the first and second selection transistors, applying a bias lower than the programming voltage to the second well terminal connection line; and processing of causing a potential of the first well terminal connection line to be higher than a potential of the second well terminal connection line to which a bias lower than the programming voltage is applied.

[Supplementary Note 20]

A program causing a computer of a semiconductor device provided with a two terminal element including a first terminal and a second terminal, a first wiring connected to the first terminal, a second wiring connected to the second terminal, and extending in a direction crossing the first wiring in a planar view, a first selection transistor connected to the first wiring, a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, to execute:

processing of supplying a programming voltage from the first programming driver;

processing of supplying a ground voltage from the second programming driver;

processing of applying a conductive voltage from the first selection transistor to one of the first wirings, and not applying a conductive voltage from the first selection transistor to a wiring other than the one wiring;

processing of applying a conductive voltage from the second selection transistor to one of the second wirings, and not applying a conductive voltage from the second selection transistor to a wiring other than the one wiring;

processing of, when the programming voltage is supplied from the first programming driver to the one wiring to which a conductive voltage is applied from the first and second selection transistors, applying a bias having a positive potential to the first well terminal connection line; and processing of causing a potential of the second well terminal connection line to be lower than a potential of the first well terminal connection line to which the bias having the positive potential is applied.

[Supplementary Note 21]

A program causing a computer of a semiconductor device provided with a two terminal element including a first terminal and a second terminal, a first wiring connected to the first terminal, a second wiring connected to the second terminal, and extending in a direction crossing the first wiring in a planar view, a first selection transistor connected to the first wiring, a second selection transistor connected to the second wiring, a first well terminal connection line to which a well terminal of the first selection transistor is connected, a second well terminal connection line to which a well terminal of the second selection transistor is connected, and a first programming driver to be connected to the first wiring via the first selection transistor, and a second programming driver to be connected to the second wiring via the second selection transistor, to execute:

processing of supplying a programming voltage from the first programming driver;

processing of supplying a ground voltage from the second programming driver;

processing of applying a conductive voltage from the first selection transistor to one of the first wirings, and not applying a conductive voltage from the first selection transistor to a wiring other than the one wiring;

processing of applying a conductive voltage from the second selection transistor to one of the second wirings, and not applying a conductive voltage from the second selection transistor to a wiring other than the one wiring;

processing of, when the programming voltage is supplied from the first programming driver to the one wiring to which a conductive voltage is applied from the first and second selection transistors, applying a bias lower than the programming voltage to the second well terminal connection line; and processing of causing a potential of the first well terminal connection line to be higher than a potential of the second well terminal connection line to which a bias lower than the programming voltage is applied.

In the foregoing, the present invention is described by way of the above-described example embodiments as an exemplary example. The present invention, however, is not limited to the above-described example embodiments. Specifically, the present invention is applicable to various aspects comprehensible to a person skilled in the art within the scope of the present invention.

REFERENCE SIGNS LIST

101 First wiring
102 Second wiring
103 Second switch element
104 First switch element
105 Intermediate node
106 First selection transistor
107 Second selection transistor
108 First programming driver
109 Second programming driver
110 Unit element
111 First decode wiring
112 Second decode wiring
113 First well terminal connection line
114 Second well terminal connection line
120 Second intermediate node selection transistor
121 First intermediate node selection transistor
122 Intermediate node control line
123 Intermediate node programming driver
124 Array
125, 127, 128a, 128b Well wiring
126 Sharing type intermediate node selection switch element
131 First switch
132 Second switch

The invention claimed is:

1. A semiconductor device comprising:
a variable-resistance type first switch including a first terminal and a second terminal, and configured in such a way that a resistance state changes by applying a voltage between the first and second terminals;
a variable-resistance type second switch including a third terminal and a fourth terminal, forming an intermediate node by connection of the third terminal to the second terminal, and configured in such a way that a resistance state changes by applying a voltage between the third and fourth terminals;
a first wiring connected to the first terminal;
a second wiring connected to the fourth terminal, and extending in a direction crossing the first wiring in a planar view;
a first selection transistor connected to the first wiring;
a second selection transistor connected to the second wiring;
a first well terminal connection line to which a well terminal of the first selection transistor is connected; and
a second well terminal connection line to which a well terminal of the second selection transistor is connected, wherein
the first well terminal connection line and the second well terminal connection line are electrically insulated.

2. The semiconductor device according to claim 1, wherein
at least either a set of the first wiring, the first selection transistor, and a first decode signal line to be connected to the first selection transistor, or a set of the second wiring, the second selection transistor, and a second decode signal line to be connected to the second selection transistor is provided by one or more, and
the semiconductor device comprises an array unit in which a unit element constituted of the first switch and the second switch is disposed in a matrix shape at each of intersection points between the first wiring and the second wiring.

3. The semiconductor device according to claim 2, further comprising
a first programming driver to be connected to the first wiring via the first selection transistor; and
a second programming driver to be connected to the second wiring via the second selection transistor, wherein the semiconductor device comprises at least either a configuration in which the first programming driver is connected to a plurality of the first selection transistors, or a configuration in which the second programming driver is connected to a plurality of the second selection transistors.

4. The semiconductor device according to claim 3, wherein
a programming voltage is supplied from the first programming driver,
a ground voltage is supplied from the second programming driver,
a conductive voltage is applied from the first selection transistor to one of the first wirings, and a conductive voltage is not applied from the first selection transistor to a wiring other than the one wiring,
a conductive voltage is applied from the second selection transistor to one of the second wirings, and a conductive voltage is not applied from the second selection transistor to a wiring other than the one wiring, and,
when the programming voltage is supplied from the first programming driver to the one wiring to which a conductive voltage is applied from the first and second selection transistors, a bias having a positive potential is applied to the first well terminal connection line and causes a potential of the second well terminal connection line to be lower than a potential of the first well terminal connection line to which the bias having the positive potential is applied.

5. The semiconductor device according to claim 3, wherein
a programming voltage is supplied from the first programming driver,
a ground voltage is supplied from the second programming driver,
a conductive voltage is applied from the first selection transistor to one of the first wirings, and a conductive voltage is not applied from the first selection transistor to a wiring other than the one wiring,
a conductive voltage is applied from the second selection transistor to one of the second wirings, and a conductive voltage is not applied from the second selection transistor to a wiring other than the one wiring, and,
when the programming voltage is supplied from the first programming driver to the one wiring to which a conductive voltage is applied from the first and second selection transistors, a bias lower than the programming voltage is applied to the second well terminal connection line and causes a potential of the first well terminal connection line to be higher than a potential of the second well terminal connection line to which a bias lower than the programming voltage is applied.

6. The semiconductor device according to claim 3, further comprising
an intermediate node selection circuit for switching a connection state between an intermediate node control line for transmitting a signal to control a voltage or a current of the intermediate node and the intermediate node, for each of the intermediate nodes, wherein
the intermediate node selection circuit switches a connection state between the intermediate node control line and the intermediate node, based on a signal from a first decode signal line to be connected to the first selection transistor, and a signal from a second decode signal line to be connected to the second selection transistor.

7. The semiconductor device according to claim 6, wherein
the intermediate node selection circuit includes a first intermediate node selection transistor and a second intermediate node selection transistor,
the first intermediate node selection transistor includes a fifth terminal, a sixth terminal, and a first gate terminal,
the second intermediate node selection transistor includes a seventh terminal, an eighth terminal, and a second gate terminal,
the fifth terminal is connected to the intermediate node control line,
the sixth terminal and the seventh terminal are connected to each other,
the eighth terminal is connected to the intermediate node,
either the first gate terminal or the second gate terminal is connected to the first decode signal line, and another is connected to the second decode signal line, and
a third well terminal connection line which is connected to a well terminal between the first intermediate node selection transistor and the second intermediate node selection transistor, the first well terminal connection line, and the second well terminal connection line are electrically insulated.

8. The semiconductor device according to claim 7, further comprising
an intermediate node programming driver to be connected to the intermediate node control line, wherein
a programming voltage is supplied from the intermediate node programming driver,
a ground voltage is supplied from the first and second programming drivers,
a conductive voltage is applied from the first selection transistor to one of the first wirings, and a conductive voltage is not applied from the first selection transistor to a wiring other than the one wiring,
a conductive voltage is applied from the second selection transistor to one of the second wirings, and a conductive voltage is not applied from the second selection transistor to a wiring other than the one wiring, and,
when the programming voltage is supplied from the intermediate node programming driver to the one wiring to which a conductive voltage is applied from the first and second selection transistors, a bias having a positive potential is applied to the third well terminal connection line and causes a potential of each of the first and second well terminal connection lines to be lower than a potential of the third well terminal connection line to which the bias having the positive potential is applied.

9. The semiconductor device according to claim 7, wherein
at least either a set of the first wiring, the first selection transistor, and the first decode signal line, or a set of the second wiring, the second selection transistor, and the second decode signal line is provided by one or more,
the semiconductor device comprises an array unit in which a unit element constituted of the first switch and the second switch is disposed in a matrix shape at each of intersection points between the first wiling and the second wiring,
the second intermediate node selection transistor is provided for each of a plurality of the intermediate node selection circuits, and
the first intermediate node selection transistor of one of the intermediate node selection circuits also serves as the first intermediate node selection transistor of at least another of the intermediate node selection circuits, and is also connected to the second intermediate node selection transistor of the another intermediate node selection circuit.

10. The semiconductor device according to claim 7, wherein the second intermediate node selection transistor is disposed in a matrix shape in association with the unit element, and a fourth well terminal connection line being connected to a well terminal of the second intermediate node selection transistor is commonly wired only in a row direction or a column direction.

11. The semiconductor device according to claim 7, wherein the second intermediate node selection transistor is disposed in a matrix shape in association with the unit element, and a fifth well terminal connection line being connected to a well terminal of the first intermediate node selection transistor is commonly wired only in a direction orthogonal to the first decode signal line.

12. The semiconductor device according to claim 1, wherein the first switch and the second switch are each a bipolar resistance variable element, and a unit element constituted of the first switch and the second switch forms the intermediate node by connecting terminals having a same polarity to each other.

13. A control method for a semiconductor device provided with
  a variable-resistance type first switch including a first terminal and a second terminal, and configured in such a way that a resistance state changes by applying a voltage between the first and second terminals,
  a variable-resistance type second switch including a third terminal and a fourth terminal, forming an intermediate node by connection of the third terminal to the second terminal, and configured in such a way that a resistance state changes by applying a voltage between the third and fourth terminals,
  a first wiring connected to the first terminal,
  a second wiring connected to the fourth terminal, and extending in a direction crossing the first wiring in a planar view,
  a first selection transistor connected to the first wiring,
  a second selection transistor connected to the second wiring,
  a first well terminal connection line to which a well terminal of the first selection transistor is connected,
  a second well terminal connection line to which a well terminal of the second selection transistor is connected, and
  a first programming driver to be connected to the first wiring via the first selection transistor, and a second programming driver to be connected to the second wiring via the second selection transistor, the control method comprising:
supplying a programming voltage from the first programming driver;
supplying a ground voltage from the second programming driver;
applying a conductive voltage from the first selection transistor to one of the first wirings, and not applying a conductive voltage from the first selection transistor to a wiring other than the one wiring;
applying a conductive voltage from the second selection transistor to one of the second wirings, and not applying a conductive voltage from the second selection transistor to a wiring other than the one wiring;
when the programming voltage is supplied from the first programming driver to the one wiring to which a conductive voltage is applied from the first and second selection transistors, applying a bias having a positive potential to the first well terminal connection line; and
causing a potential of the second well terminal connection line to be lower than a potential of the first well terminal connection line to which the bias having the positive potential is applied.

* * * * *